US 9,373,665 B2

(12) United States Patent
Terai

(10) Patent No.: US 9,373,665 B2
(45) Date of Patent: *Jun. 21, 2016

(54) RESISTANCE CHANGE NONVOLATILE MEMORY DEVICE, SEMICONDUCTOR DEVICE, AND METHOD OF MANUFACTURING RESISTANCE CHANGE NONVOLATILE MEMORY DEVICE

(71) Applicant: Renesas Electronics Corporation, Tokyo (JP)

(72) Inventor: Masayuki Terai, Tokyo (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/830,660

(22) Filed: Aug. 19, 2015

(65) Prior Publication Data

US 2015/0357381 A1 Dec. 10, 2015

Related U.S. Application Data

(63) Continuation of application No. 13/551,511, filed on Jul. 17, 2012, now Pat. No. 9,123,889.

(30) Foreign Application Priority Data

Sep. 14, 2011 (JP) .................................. 2011-200500

(51) Int. Cl.
*G11C 11/00* (2006.01)
*H01L 27/24* (2006.01)
(Continued)

(52) U.S. Cl.
CPC ........ *H01L 27/2463* (2013.01); *G11C 13/0004* (2013.01); *G11C 13/004* (2013.01);
(Continued)

(58) Field of Classification Search
CPC ........... G11C 13/0069; G11C 13/0004; G11C 13/0007; G11C 13/004

USPC ..................................... 365/148, 163, 189.16
See application file for complete search history.

(56) References Cited

U.S. PATENT DOCUMENTS 5,990,007 A   11/1999   Kajita et al.
7,476,618 B2   1/2009   Kilpela et al.
(Continued)

FOREIGN PATENT DOCUMENTS

JP      H 10-214896 A    8/1998
JP      2006-128680 A    5/2006
(Continued)

OTHER PUBLICATIONS

W. W. Zhuang et al., "Novel Colossal Magnetoresistive Thin Film Nonvolatile Resistance Random Access Memory (RRAM)", IEDM, Article No. 7.5, pp. 193-196, 2002.
(Continued)

*Primary Examiner* — Pho M Luu
(74) *Attorney, Agent, or Firm* — McGinn IP Law Group, PLLC

(57) ABSTRACT

A resistance change nonvolatile memory device, includes: a first wiring; an interlayer insulating layer formed over the first wiring; and a second wiring formed over the interlayer insulating layer, wherein the interlayer insulating layer is interposed between the first wiring and the second wiring and includes a hole having a width not greater than a width of the first wiring, wherein the resistance change nonvolatile memory device further includes a lower electrode formed at a bottom portion of the hole and contacting the first wiring; a resistance change layer formed on the lower electrode; and an upper electrode formed over the resistance change layer, wherein the lower electrode, the resistance change layer, and the upper electrode are formed inside the hole, wherein an entirety of the resistance change layer is disposed inside the hole.

20 Claims, 20 Drawing Sheets

(51) Int. Cl.
*H01L 45/00* (2006.01)
*G11C 13/00* (2006.01)

(52) U.S. Cl.
CPC ........ *G11C13/0069* (2013.01); *H01L 27/2436* (2013.01); *H01L 45/04* (2013.01); *H01L 45/1233* (2013.01); *H01L 45/1253* (2013.01); *H01L 45/145* (2013.01); *H01L 45/146* (2013.01); *H01L 45/16* (2013.01); *H01L 45/1666* (2013.01); *G11C 2213/51* (2013.01)

(56) References Cited

U.S. PATENT DOCUMENTS

| | | | |
|---|---|---|---|
| 7,623,370 | B2 | 11/2009 | Toda et al. |
| 7,699,945 | B2 | 4/2010 | Yoshii et al. |
| 7,869,259 | B2 | 1/2011 | Asao |
| 7,989,794 | B2 | 8/2011 | Toda et al. |
| 8,036,017 | B2 | 10/2011 | Awaya et al. |
| 8,394,669 | B2 | 3/2013 | Arita et al. |
| 8,507,889 | B2 | 8/2013 | Nagashima |
| 8,853,663 | B2 * | 10/2014 | Sumino .............. G11C 13/0002 257/1 |
| 8,957,399 | B2 * | 2/2015 | Wei .................... G11C 11/5685 257/2 |
| 9,082,479 | B2 * | 7/2015 | Wei .......................... H01L 45/08 |
| 9,123,889 | B2 * | 9/2015 | Terai ...................... H01L 45/04 |
| 2006/0121733 | A1 | 6/2006 | Kilpela et al. |
| 2008/0280390 | A1 | 11/2008 | Kim et al. |
| 2010/0027319 | A1 | 2/2010 | Noshiro |

FOREIGN PATENT DOCUMENTS

| | | |
|---|---|---|
| JP | 2006-269623 A | 10/2006 |
| JP | 2008-84402 A | 4/2008 |
| JP | 2008-283179 A | 11/2008 |
| JP | 2009-117668 A | 5/2009 |
| JP | 2009-295842 A | 12/2009 |
| JP | 2010-027753 A | 2/2010 |
| WO | WO 2011/007538 A1 | 1/2011 |

OTHER PUBLICATIONS

G.-S. Park et al., "Observation of electric-field induced Ni filament channels in polycrystalline $NiO_x$ film", APL, vol. 91, pp. 222103, 2007.

C. Yoshida et al., "High speed resistive switching in $Pt/TiO_2/TiN$ film for nonvolatile memory application", APL, vol. 91, pp. 223510, 2007.

F. Gibbons et al., "Switching properties of thin NiO Films", Solid State Electronics, vol. 7, pp. 785, 1964.

Kinoshita et al., "Bias polarity dependent data retention of resistive random access memory consisting of binary transition metal oxide", APL, vol. 89, pp. 103509, 2006.

Japanese Office Action dated Oct. 15, 2014 with an English Translation thereof.

Japanese Office Action dated Mar. 10, 2015 with an English translation thereof.

U.S. Non-Final Office Action dated May 7, 2014 in U.S. Appl. No. 13/551,511.

U.S. Notice of Allowance dated Sep. 15, 2014 in U.S. Appl. No. 13/551,511.

U.S. Notice of Allowance dated Jan. 21, 2015 in U.S. Appl. No. 13/551,511.

U.S. Notice of Allowance dated May 1, 2015 in U.S. Appl. No. 13/551,511.

\* cited by examiner

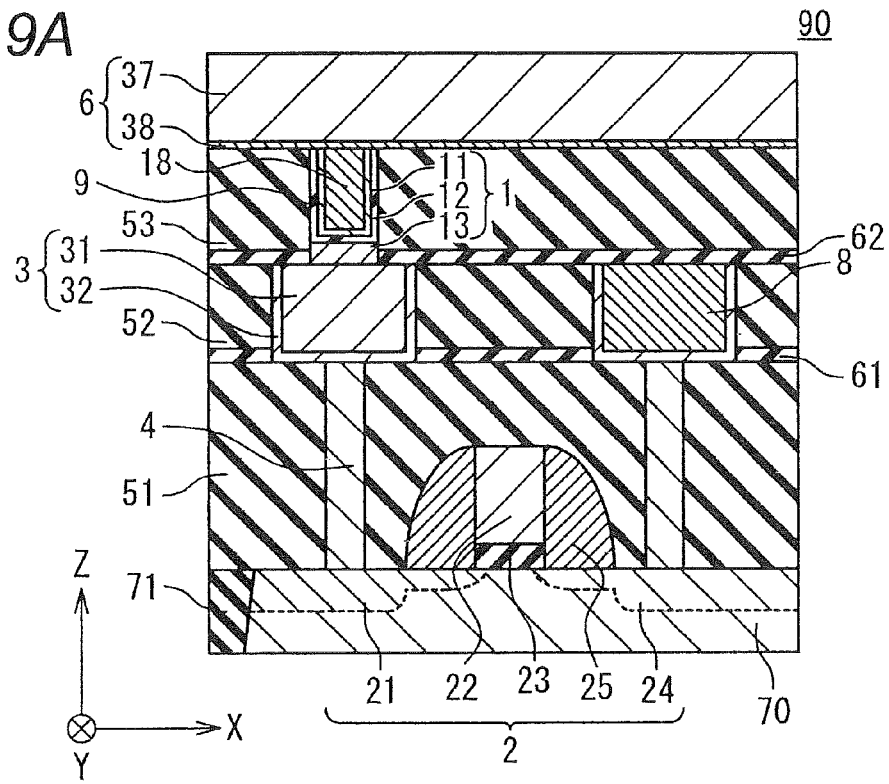
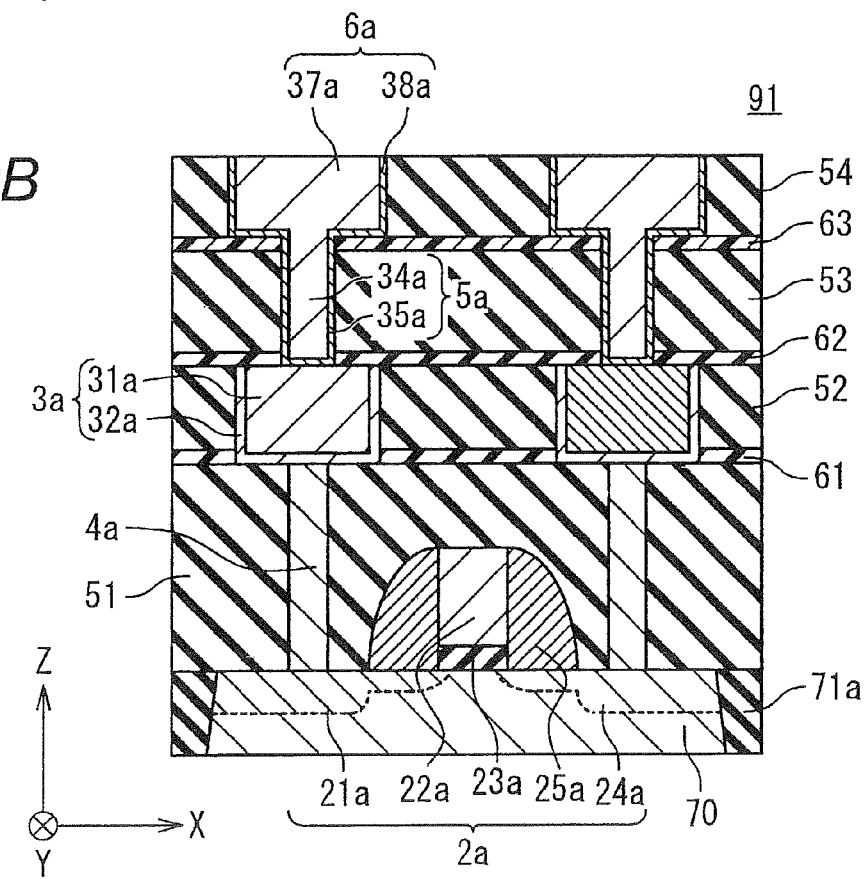

RESISTANCE CHANGE NONVOLATILE MEMORY DEVICE, SEMICONDUCTOR DEVICE, AND METHOD OF MANUFACTURING RESISTANCE CHANGE NONVOLATILE MEMORY DEVICE

CROSS-REFERENCE TO RELATED APPLICATIONS

The present application is a Continuation Application of U.S. patent application Ser. No. 13/551,511, filed on Jul. 17, 2012, now U.S. Pat. No. 9,123,889 B2, issued on Sep. 1, 2015, which is based on Japanese Patent Application No. 2011-200500 filed on Sep. 14, 2011, the entire contents of which are hereby incorporated by reference.

BACKGROUND

The present invention relates to a resistance change nonvolatile memory device, a semiconductor device, and a method of manufacturing a resistance change nonvolatile memory device.

In nonvolatile memory fields, there has been much research on flash memories, ferroelectric memories (Ferroelectric Random Access Memory: FeRAM), magnetic memories (Magnetic Random Access Memory: MRAM), OUM (Ovonic Unified Memory) and the like. As nonvolatile memories different from these related-art ones, however, resistance change memories (Resistance Random Access Memory: ReRAM) have recently been proposed. For example, the resistance change memory described in Non-patent Document 1 can write data by setting the resistance of the resistance change layer of a memory cell by application of a voltage pulse. In addition, it can read data by measuring resistance in a non-destructive manner. This resistance change memory can be multivalued because memory cells have a small area. Therefore, it has a possibility exceeding the existing nonvolatile memories. In Non-patent Document 1, PCMO ($Pr_{0.7}Ca_{0.3}MnO_3$) and YBCO ($YBa_2Cu_3O_y$) are used as the resistance change layer. Another proposal has been made for a resistance change memory. For example, the resistance change memory described in Non-patent Document 2 uses a polycrystalline $NiO_x$ (x=from 1 to 1.5) film of about 50 nm thick as the resistance change layer. Switching to a low resistance state or to a high resistance state is achieved by applying a positive voltage to the upper electrode. The resistance change memory described in Non-patent Document 3 uses a microcrystalline $TiO_2$ film of 80 nm thick as the resistance change layer.

In general, a memory cell of a resistance change memory is equipped with a control transistor and a resistance change element. The resistance change memory having such a memory cell is also called "1T1R type". FIG. 1 is a plan view showing the configuration of a related-art 1T1R type resistance change memory. A 1T1R type resistance change memory 190 is equipped with a plurality of word lines (or gates) 122, a plurality of bit lines (or second wirings) 106, a plurality of common lines 108, and a plurality of memory cells MC. The word lines (or gates) 122 extend in the direction Y. The bit lines (or second wirings) 106 extend in the direction X. The common lines 108 extend in the direction Y. The memory cells MC are provided, respectively, at positions corresponding to the intersections between the word lines 122 and the bit lines 106.

FIG. 2 is a cross-sectional view showing the configuration of the a-a' cross-section in FIG. 1. It shows the configuration of one memory cell MC. The memory cell MC is equipped with a control transistor 102 and a resistance change element 101. A semiconductor substrate 170 has thereon an element isolation region 171 and a control transistor 102. The control transistor 102 is equipped with a gate insulating film 123, a gate 122 (word line), a drain 121, a source 124, and a sidewall 125. Contacts 104 are coupled to the drain 121 and the source 124, respectively. The control transistor 102 and the contacts 104 are covered with a first interlayer insulating film 151 and a first cap insulating film 161. The contact 104 on the side of the drain 121 is coupled to a first wiring 103 composed of a barrier metal 132 and a copper (Cu) 131 via an opening portion of the first cap insulating film 161. The first wiring 103 is covered with a second interlayer insulating film 152 and a second cap insulating film 162. The resistance change element 101 of the resistance change memory is coupled to the first wiring 103 via an opening portion of the second cap insulating film 162. The resistance change element 101 has an MIM (Metal/Insulator/Metal) structure composed of a lower electrode 113 to be coupled to the first wiring 103, a resistance change layer 112 on the lower electrode 113, and an upper electrode 111 on the resistance change layer 112. The upper electrode 111 is coupled to a first via 105 composed of a barrier metal 135 and copper (Cu) 134 and the second wiring 106 (bit line). The contact 104 on the side of the source 124 is coupled to the common line 108 via an opening portion of the first cap insulating film 161. The resistance change element 101 is covered with a third interlayer insulating film 153 and a third cap insulating film 163. The second wiring 106 is provided on the third cap insulating film 163. As shown in FIG. 2, in the related-art structure, the resistance change element 101 is formed between wiring layers (here, between the wiring layer of the first wiring 103 and the wiring layer of the second wiring 106). In this case, the resistance change element 101 has an MIM capacitor structure isolated from the resistance change element 101 of an adjacent memory cell MC. The resistance change element 101 can be considered to have a (parasitic) capacitance.

A method of operating the related-art structure will next be described. First, initialization is conducted in the following manner. A positive voltage is applied to the upper electrode 111 via the second wiring 106 to reduce the resistance of the resistance change layer 112 (Forming). At this time, the voltage to be applied to the gate 122 is adjusted so as to impose a current limitation by a saturated current value of the control transistor 102. As a result, the resistance change layer 112 has a desired resistance value. Incidentally, Forming may be conducted by applying a positive voltage to the lower electrode 113 instead of applying it to the upper electrode 111.

Write operation is conducted in the following manner. For switching from a low resistance state to a high resistance state, a positive voltage is applied to the source 124 and the gate 122. For switching from a high resistance state to a low resistance state, a positive voltage is applied to the upper electrode 111 and the gate 122. At this time, a voltage higher than that applied upon switching to a high resistance state is applied to the common line 108. In addition, a voltage to be applied to the gate 122 is adjusted so as to impose a current limitation by a saturated current value of the control transistor 102. As a result, the resistance change layer 112 has a desired resistance value. Switching operation from a high resistance state to a low resistance state or switching operation from a low resistance state to a high resistance state can also be made by applying a positive voltage to the upper electrode 111 instead of the source 124.

As a related technology, Japanese Patent Laid-Open No. 2009-117668 discloses a variable resistor for nonvolatile memory, a manufacturing method thereof, and a nonvolatile memory. A variable resistor for nonvolatile memory according to this document is equipped with an interlayer insulating film, a lower electrode, a variable resistance layer, an upper electrode, and a second-level wiring layer. The interlayer insulating film is provided on the first-level wiring layer and has a through-hole to be coupled to the first-level wiring layer. The lower electrode is provided in the through-hole and coupled to the first-level wiring layer. The variable resistance layer is provided on the lower electrode in the through-hole. The upper electrode is provided on the variable resistance layer in the through-hole. The second-level wiring layer is provided on the interlayer insulating film and coupled to the upper electrode. Another variable resistor for nonvolatile memory according to this document is equipped with a variable resistance layer, an interlayer insulating film, and a plug metal. The variable resistance layer is provided on the surface of the first-level wiring layer. The interlayer insulating film is provided on the first-level wiring layer. The plug metal is provided in the interlayer insulating film and coupled to the variable resistance layer.

Japanese Patent Laid-Open No. 2010-027753 discloses a nonvolatile memory element and a manufacturing method thereof. This nonvolatile memory element is equipped with a first electrode, an interlayer insulating film, an opening portion, a resistance change film, and a second electrode. The first electrode is formed on a substrate. The interlayer insulating film is formed on the first electrode. The opening portion penetrates through the interlayer insulating film. The resistance change film is formed at least on the bottom portion of the opening portion and coupled to the first electrode. The second electrode is formed adjacent to the resistance change film and at the same time, buried in the opening portion. The resistance change film interposed between the first electrode and the second electrode configures a memory portion characterized in that it undergoes an increase or decrease in resistance by application of an electric pulse. Data is stored or read, depending on a change in the resistance value. This means that the first electrode also serves as a first wiring. An opening portion is formed on the first electrode. The opening portion has, on the bottom portion and inner wall thereof, the resistance change layer. The second electrode is formed on the inner side of the resistance change layer.

Japanese Patent Laid-Open No. 2009-295842 discloses a semiconductor memory device and a manufacturing method thereof. This semiconductor memory device is equipped with an interlayer insulating film, a conductive pattern, a lower electrode, a transition metal oxide film, and an upper electrode. The interlayer insulating film is formed above the substrate and has a trench. The conductive pattern is buried in the interlayer insulating film surrounded with a trench. The lower electrode is formed at least on the conductive pattern and the side wall of the trench. The transition metal oxide film is formed on the lower electrode. The upper electrode is formed on the transition metal oxide film on at least a portion of the conductive pattern and the side wall of the trench.

Japanese Patent Laid-Open No. 2006-128680 discloses selective formation of a metal layer in an integrated circuit. This method for selectively forming a conductive layer in an integrated circuit includes a step of providing a first surface composed of copper and a second surface and a step of bringing the first surface and the second surface into contact with a gas phase compound of a noble metal to selectively form the conductive layer made of the noble metal on the first surface compared with the second surface.

[Patent Document 1]
 Japanese Patent Laid-Open No. 2009-117668

[Patent Document 2]
 Japanese Patent Laid-Open No. 2010-027753
[Patent Document 3]
 Japanese Patent Laid-Open No. 2009-295842
[Patent Document 4]
 Japanese Patent Laid-Open No. 2006-128680
[Non-Patent Document 1]
 W. W. Zhuang et al., "Novel Colossal Magnetoresistive Thin Film Nonvolatile Resistance Random Access Memory (RRAM)", IEDM, Article No. 7.5, pp. 193-196, 2002.
[Non-Patent Document 2]
 G.-S. Park et al., "Observation of electric-field induced Ni filament channels in polycrystalline $NiO_x$ film", APL, Vol. 91, pp. 222103, 2007.
[Non-Patent Document 3]
 C. Yoshida et al., "High speed resistive switching in $Pt/TiO_2/TiN$ film for nonvolatile memory application", APL, Vol. 91, pp. 223510, 2007.
[Non-Patent Document 4]
 J. F. Gibbons et al., "Switching properties of thin NiO Films", Solid State Electronics, vol. 7, pp. 785, 1964.
[Non-Patent Document 5]
 K. Kinoshita et al., "Bias polarity dependent data retention of resistive random access memory consisting of binary transition metal oxide", APL, vol. 89, pp. 103509, 2006.

SUMMARY

The resistance change element of a resistance change memory having a related-art structure has the following problems due to damage done to the side wall portion upon processing of an MIM structure.

FIGS. 3A and 3B describe the switching principle of a resistance change memory (Non-patent Document 4, Non-patent Document 5). As shown in FIG. 3A, the resistance change element of the resistance change memory is equipped with an upper electrode 111 (example: a metal), a resistance change layer 112 (example: a transition metal oxide), and a lower electrode 113 (example: a metal). As shown in FIG. 3B, when a voltage is applied to the upper electrode 111 to reduce the resistance (Forming) of the resistance change element, a current path 114 is formed in the resistance change layer 112. When a voltage is applied to between the upper electrode 111 and the lower electrode 113 while having this current path 114, an oxidation-reduction reaction occurs in the current path 114, which causes a change in the resistance value of the current path 114.

FIG. 4 shows the problem of the resistance change memory. A change in the resistance value of the current path 114 of the resistance change element is presumed to occur by oxidation-reduction in the current path 114 in the vicinity of the interface with the upper/lower electrode. As shown in FIG. 4, however, the number of current paths actually formed per resistance change element is not one but current paths including an incomplete current path 116 are formed at various places in the resistance change layer 112. In particular, a current path 115 is easily formed on a side portion 117 suffering etching damage. When in switching operation after resistance reduction (Forming), electricity is conducted through the incomplete current path 116 or through the current path 115 in the vicinity of the damaged side portion 117, a resistance value decreases drastically, becoming a cause of malfunction. In particular, the switching characteristic of the current path 115 in the vicinity of the damaged side portion 117 is different from the switching characteristic of the current path 114 in the vicinity of the electrode center not suffering damage. This leads to variations in the performance of the resistance change element or drastic deterioration in reliability.

Thus, variations in the performance of a resistance change element or drastic deterioration in reliability occurs due to the film quality of the resistance change layer or the positional relationship between the effective region of the resistance change layer and the end portion of the resistance change layer.

As shown in FIGS. 1 and 2, a plurality of memory cells MC is coupled to one bit line 106. For speed-up, decreasing the area of the memory cells MC to reduce a parasitic capacitance is necessary. Since the memory cells MC each have an isolated MIM structure, however, patterning of MC with a reduced area is difficult. Even in consideration of a misalignment allowance with the opening portion of the second cap insulating film 162, it is difficult to achieve reduction in capacitance by decreasing the area of the resistance change element 101.

In addition, in the related-art structure, wiring layers (here, the first wiring 103 and the second wiring 106) have therebetween the resistance change element 101 having an MIM structure and the via 105 for coupling the upper electrode 111 and the second wiring 106. When the thickness between these wiring layers becomes small due to scaling, it becomes difficult to form the resistance change element 101. Moreover, for mounting the element having the related-art structure to a logic LSI, at least twice PR steps (patterning of the opening of the second cap insulating film 162 and MIM structure) should be added, making it difficult to decrease a manufacturing cost.

In Japanese Patent Laid-Open No. 2009-117668 (Patent Document 1), the variable resistor has, inside the through-hole, a lower electrode in the lower portion thereof, the resistance change layer on the surface of the lower electrode, and the upper electrode on the surface of the resistance change layer. The resistance change layer is formed, for example, by oxidizing the surface of the lower electrode (FIGS. 10 to 12, 14 and 15 of Patent Document 1). In Example using this method, the cross-section of the through-hole is equal to the cross-section of the resistance change layer, the upper electrode, and the lower electrode. This means that in a cross-section parallel to the substrate, the effective region of the resistance change element extends to the end portion of the resistance change layer. There is therefore a fear of variations in characteristics due to this end portion (the problem pointed out in FIG. 4). Moreover, the lower electrode and the resistance change layer are inevitably composed of the same metal component. In another method, the resistance change layer made of a film different from that of the lower electrode is formed on the surface of the lower electrode (FIG. 13 of Patent Document 1). In Example using this method, the end portion of the cross-section of the resistance change layer parallel to the substrate is distant from the effective region of the resistance change element. Variations in characteristics due to the end portion are therefore small. However, the resistance change layer is inserted between the second-level wiring layer and the interlayer insulating film so that a decrease in the thickness of the wiring layer as a result of scaling may make it difficult to form the second-level wiring layer. In a further method, the resistance change layer made of a film different from that of the lower electrode is formed on the surface of the lower electrode and the barrier layer (FIG. 16 of Patent Document 1). In Example using this method, the end portion of the resistance change layer is distant from the effective region of the resistance change element. Variations in characteristics due to the end portion are therefore small.

However, parasitic capacitance is generated among the upper electrode, the resistance change layer, and the barrier layer, which poses a problem.

In the nonvolatile memory element disclosed in Japanese Patent Laid-Open No. 2010-027753 (Patent Document 2), only the resistance change layer and the second electrode (upper electrode) are provided inside the opening portion and the first electrode (lower electrode) is provided outside the opening portion. The first electrode also serves as a first wiring so that the material used for the first electrode (=first wiring) is limited. When a material having properties optimum for the resistance change element is used as a material for the first wiring (=first electrode), a wiring formation process different from the related-art one should be employed. A manufacturing process therefore needs to be reviewed, which may lead to an increase in the manufacturing cost.

In the semiconductor memory device disclosed in Japanese Patent Laid-Open No. 2009-29584 (Patent Document 3), an MIM structure is formed separately from a through-hole or a via or wiring in an opening so that the height corresponding to the MIM structure cannot be decreased. A decrease in the thickness between wiring layers as a result of scaling therefore makes it difficult to form the MIM structure. In addition, scaling cannot be conducted also from the standpoint of the necessity of a dummy trench in this device.

A means for overcoming the above problems will hereinafter be described using a number or symbol used in the mode for carrying out the invention. These numbers or symbols are shown in parentheses to clarify the corresponding relationship between the description in the claims and the mode for carrying out the invention. These numbers or symbols should not be used for construing the technical scope of the invention described in the claims.

A resistance change nonvolatile memory device according to the invention is equipped with a first wiring (3), an interlayer insulating film (53), a second wiring (6), and a resistance change element (1, 1*a*). The interlayer insulating film (53) is formed on the first wiring (3). The second wiring (6) is formed on the interlayer insulating film (53). The resistance change element (1, 1*a*) is formed between the first wiring (3) and the second wiring (6). The interlayer insulating film (53) is interposed between the first wiring (3) and the second wiring (6) and has a hole (9) having a width not greater than the width of the first wiring (3). The resistance change element (1, 1*a*) is equipped with a lower electrode (13, 13*a*), a resistance change layer (12, 12*a*) and an upper electrode (11, 11*a*). The lower electrode (13, 13*a*) is formed on the bottom portion of the hole (9) while being brought into contact with the first wiring (3). The resistance change layer (12, 12*a*) is formed on the lower electrode (13, 13*a*). The upper electrode (11, 11*a*) is formed on the resistance change layer (12, 12*a*). The lower electrode (13, 13*a*), the resistance change layer (12, 12*a*) and the upper electrode (11, 11*a*) are formed inside the hole (9). The first wiring (3) contains copper, while the lower electrode (13, 13*a*) contains at least one metal selected from the group constituting of ruthenium, tungsten, cobalt, platinum, gold, rhodium, iridium, and palladium.

Another resistance change nonvolatile memory device according to the invention is equipped with a first wiring (3), an interlayer insulating film (53), a second wiring (6), and a resistance change element (1, 1*a*). The interlayer insulating film (53) is formed on the first wiring (3). The second wiring (6) is formed on the interlayer insulating film (53). The resistance change element (1, 1*a*) is formed between the first wiring (3) and the second wiring (6). The interlayer insulating film (53) is inserted between the first wiring (3) and the second wiring (6) and has a hole (9) having a width not greater than the width of the first wiring (3). The resistance change element (1, 1a) is equipped with a lower electrode (13, 13a), a resistance change layer (12, 12a), and an upper electrode (11, 11a). The lower electrode (13, 13a) is formed on the bottom portion of the hole (9) while being brought into contact with the first wiring (3). The resistance change layer (12, 12a) is formed on the lower electrode (13, 13a). The upper electrode (11, 11a) is formed on the resistance change layer (12, 12a). The lower electrode (13, 13a), the resistance change layer (12, 12a), and the upper electrode (11, 11a) are formed inside the hole (9). The end portions of the resistance change layer (12, 12a) and the upper electrode (13, 13a) are in contact with the bottom surface of the second wiring (6).

A semiconductor device according to the invention is equipped with a plurality of resistance change nonvolatile memory devices (90/90a) and a logic circuit (91) using the resistance change nonvolatile memory devices (90/90a). The resistance change nonvolatile memory devices (90/90a) are those described in the above paragraph.

A method of manufacturing a resistance change nonvolatile memory device according to the invention has a step of forming, in an interlayer insulating film (53) formed on a first wiring (3), a hole (9) having a width not greater than the width of the first wiring (3), a step of forming a resistance change element (1, 1a) inside the hole (9), and a step of forming a second wiring (6) on the resistance change element (1, 1a) so as to bring the second wiring into contact with the resistance change element (1, 1a). The step of forming the resistance change element (1, 1a) has a step of forming a lower electrode (13, 13a) on the bottom portion of the hole (9) while bringing the lower electrode into contact with the first wiring (3), a step of forming a first film for a resistance change layer (12, 12a) on the lower electrode (13, 13a), a step of forming a second film for an upper electrode (11, 11a) on the first film, and removing the first film and the second film on the interlayer insulating film (53). The first wiring (3) contains copper and the lower electrode (13, 13a) contains at least one metal selected from the group consisting of ruthenium, tungsten, cobalt, platinum, gold, rhodium, iridium, and palladium.

Another method of manufacturing a resistance change nonvolatile memory device according to the invention has a step of forming, an interlayer insulating film (53) formed on a first wiring (3), a hole (9) having a width not greater than the width of the first wiring (3), a step of forming a resistance change element (1, 1a) inside the hole (9), and a step of forming a second wiring (6) on the resistance change element (1, 1a) so as to bring the second wiring into contact with the resistance change element (1, 1a). The step of forming the resistance change element (1, 1a) has a step of forming a lower electrode (13, 13a) on the bottom portion of the hole (9) while bringing the lower electrode into contact with the first wiring (3), a step of forming a first film for a resistance change layer (12, 12a) on the lower electrode (13, 13a), a step of forming a second film for an upper electrode (11, 11a) on the first film, and removing the first film and the second film on the interlayer insulating film (53). The resistance change layer (12, 12a) and the upper electrode (11, 11a) are brought into contact with the bottom surface of the second wiring (6).

The invention makes it possible to conduct a stable switching operation at a low cost. In addition, according to the invention, the device can be operated at an improved operation rate. Moreover, according to the invention, problems which will otherwise occur due to device scaling can be avoided. Furthermore, the invention enables mounting with a logic LSI and therefore contributes to a reduction in manufacturing cost.

BRIEF DESCRIPTION OF DRAWINGS

FIG. 9A is a cross-sectional view showing the configuration of a region of a resistance change nonvolatile memory device in the semiconductor device according to the second embodiment of the invention;

FIG. 9B is a cross-sectional view showing the configuration of a logic LSI region in the semiconductor device according to the second embodiment of the invention;

DETAILED DESCRIPTION

Embodiments of the resistance change nonvolatile memory device, the semiconductor device, and the method of manufacturing a resistance change nonvolatile memory device will next be described referring to accompanying drawings.

Figure 1:
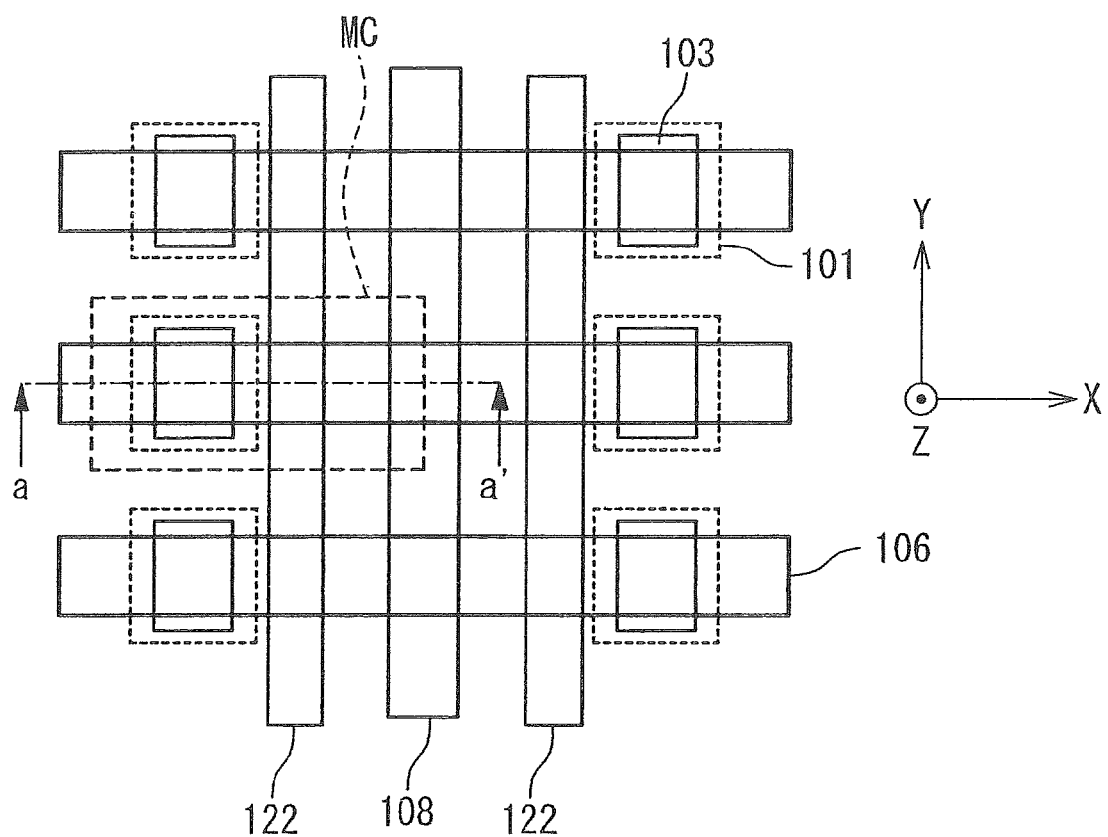
FIG. 1 is a plan view showing the configuration of a related-art 1T1R type resistance change memory.
Figure 2:
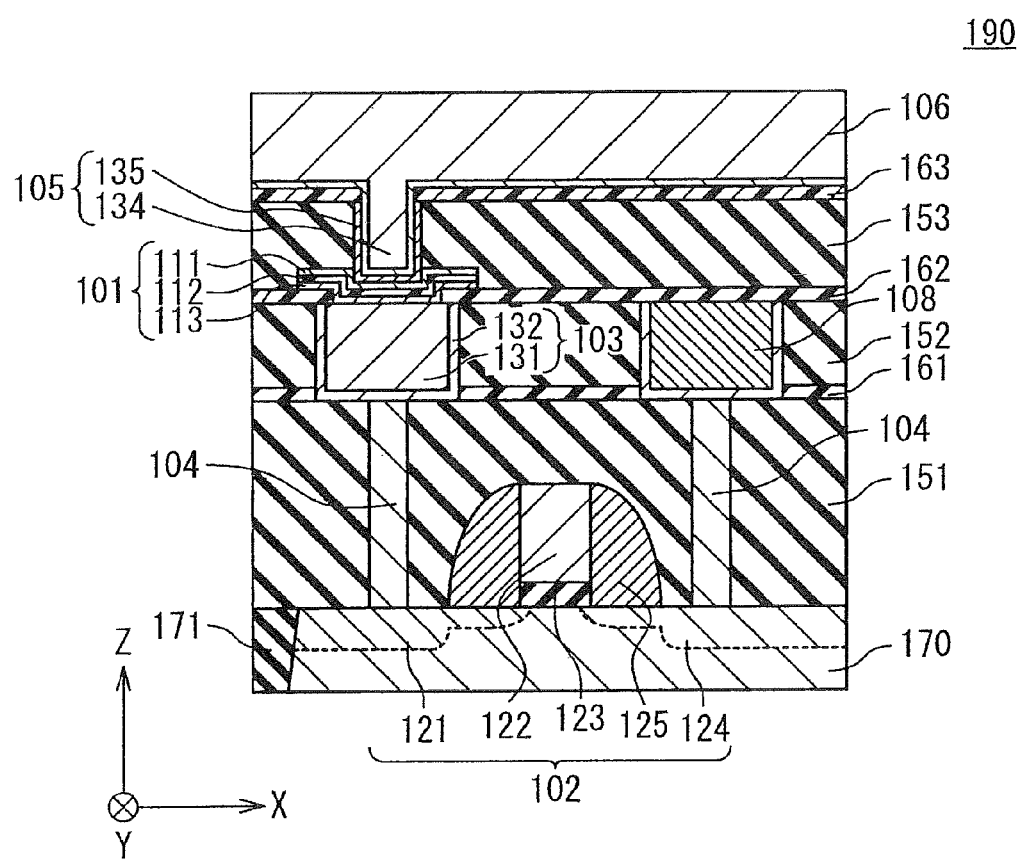
FIG. 2 is a cross-sectional view showing the configuration of the a-a' cross-section in FIG. 1.
Figure 3A:
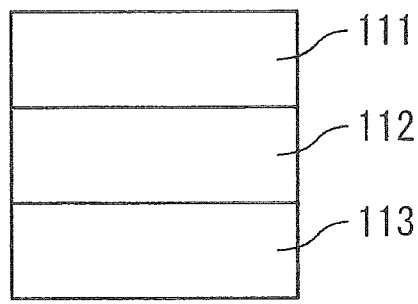
FIG. 3A describes the switching principle of a resistance change memory.
Figure 3B:
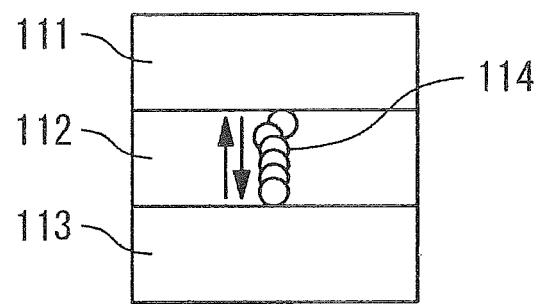
FIG. 3B describes the switching principle of a resistance change memory.
Figure 4:
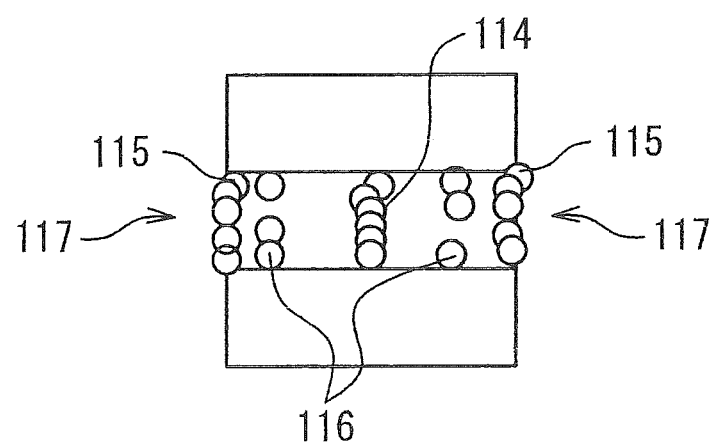
FIG. 4 shows the problem of a resistance change memory.
Figure 5:
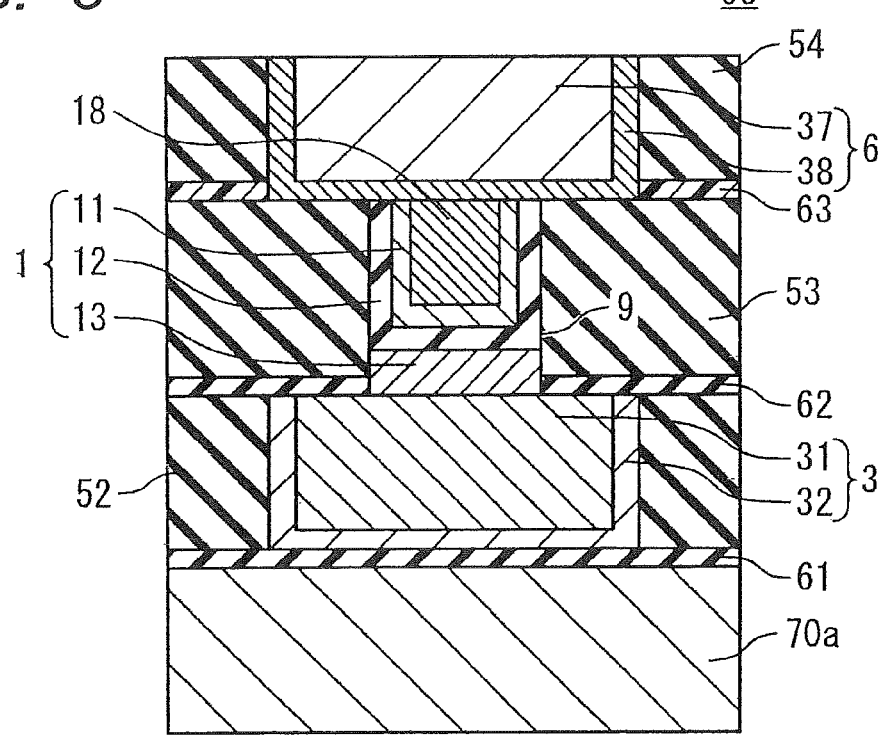
FIG. 5 is a cross-sectional view showing the configuration of the major portion of a resistance change nonvolatile memory device according to a first embodiment of the invention.

(First Embodiment) The configuration of the resistance change nonvolatile memory device according to the first embodiment of the invention will next be described referring to accompanying drawings. FIG. 5 is a cross-sectional view showing the configuration of the major portion of the resistance change nonvolatile memory device according to the first embodiment of the invention. A resistance change nonvolatile memory device 90 is equipped with a substrate 70a, a first cap insulating film 61, a first wiring 3, a second interlayer insulating film 52, a second cap insulating film 62, a resistance change element 1, a third interlayer insulating film 53, a third cap insulating film 63, a second wiring 6, and a fourth interlayer insulating film 54.

The first wiring 3 is provided on the substrate 70a. The first wiring 3 has, for example, a first metal wiring 31 and a barrier metal layer 32 covering the side surface and bottom surface of the first metal wiring. The substrate 70a is however equipped with a semiconductor substrate having an element formed in the surface region thereof and a first interlayer insulating film and a first cap insulating film 61 covering the semiconductor substrate. The first interlayer insulating film and the first cap insulating film 61 may be called a first interlayer insulating layer. The first wiring 3 is therefore provided on the first interlayer insulating layer. The first wiring 3 is buried in the interlayer insulating film 52 and covered with the second cap insulating film 62. The second interlayer insulating film 52 and the second cap insulating film 62 may also be called a second interlayer insulating layer. The first wiring 3 is therefore buried in the second interlayer insulating layer.

The third interlayer insulating film 53 is provided on the second interlayer insulating layer. The third interlayer insulating film 53 has a hole 9 therein. The hole 9 is provided so as to penetrate through the third interlayer insulating film 53 while being interposed between the first wiring 3 and the second wiring 6. The bottom surface of the hole 9 is in contact with the upper surface of the first wiring 3 and does not protrude from the upper surface. When the hole 9 has a circular transverse section (section parallel to the surface of the substrate 70a), the transverse section has a diameter not greater than the wiring width of the first wiring 3. The transverse section of the hole 9 may have another shape insofar as the bottom surface of the hole 9 does not protrude from the upper surface of the first wiring 3. In this case, the width of the hole 9 (in a direction parallel to the surface of the substrate 70a) is not greater than the wiring width of the first wiring 3. The third cap insulating film 63 is provided on the third interlayer insulating film 53. The third interlayer insulating film 53 and the third cap insulating film 63 may also be called a third interlayer insulating layer.

The resistance change element 1 stores data by utilizing a change in the resistance value. It is provided in the hole 9 formed between the first wiring 3 and the second wiring 6. The resistance change element 1 is equipped with a lower electrode 13, a resistance change layer 12, and an upper electrode 11.

The lower electrode 13 is formed only on the bottom portion of the hole 9. The end portion of it is in contact with the side wall in the vicinity of the bottom portion of the hole 9. The lower electrode 13 is made of a metal conductor. The lower electrode 13 is formed on the first wiring 3 (first metal wiring 31) in the opening portion of the second interlayer insulating layer preferably by selective growth, because the lower electrode 13 can be formed only in the hole 9 without using an additional process. The method of forming the lower electrode will be described later.

The resistance change layer 12 is formed on the lower electrode 13 and on the side wall of the hole 9. The end portion of it reaches the upper portion of the hole 9. The end portion of it is preferably in contact with the bottom surface of the second wiring 6. This makes it possible to fully separate the end portion of the resistance change layer 12 from the end portion of the lower electrode 13. As a result, as described later, the resistance change element 1 can be prevented from being affected by the end portion of the resistance change layer 12. The resistance change layer 12 may contain an oxide of a metal material different from that of the lower electrode 13.

The upper electrode 11 is formed so as to cover the inner surface of the resistance change layer 12. The end portion of it reaches the upper portion of the hole 9. The end portion of it is preferably in contact with the bottom surface of the second wiring 6, because if so, there is no necessity of additionally forming a via or contact for coupling the resistance change element 1 and the second wiring 6. The upper electrode 11 is made of a metal conductor. The upper electrode 11 may be equipped with a buried layer (metal) 18 for burying a region inside thereof.

The second wiring 6 is provided on the third interlayer insulating film 53. The second wiring 6 has, for example, a second metal wiring 37 and a barrier metal layer 38 covering the second metal wiring on the side surface and the bottom surface thereof. The second wiring 6 may be provided on the third interlayer insulating layer. The second metal wiring 6 is buried in the fourth interlayer insulating film 54.

The first metal wiring 31 is preferably a polycrystalline film having, as a main component thereof, crystal grains of (111) orientation with respect to a direction perpendicular to the surface of the substrate. This means that the first metal wiring 31 is a film having (111) orientation. It is used because it facilitates selective growth of the lower electrode 13 as will be described later. For example, when a copper (Cu) film having (111) orientation is used as the first metal wiring 31, for example, a ruthenium (Ru) film having (002) orientation can be selectively grown as the lower electrode 13. Here, the term "main component" means a component contained in the largest amount.

The first metal wiring 31 may be made of copper (Cu), aluminum (Al), or silicon (Si). When copper (Cu) or aluminum (Al) is used as the first metal wiring 31, a typical wiring and via hole can be assumed as the first metal wiring 31 and the hole 9, respectively. When silicon is used as the first metal wiring 31, a source/drain and a contact hole can be assumed as the first metal wiring 31 and the hole 9, respectively. In an example of a manufacturing method which will be described later, copper (Cu) having (111) orientation is used.

When the first metal wiring 31 is made of copper (Cu), the lower electrode 13 contains, as a main component thereof, preferably at least one metal selected from the group consisting of ruthenium (Ru), tungsten (W), cobalt (Co), platinum (Pt), gold (Au), rhodium (Rh), iridium (Ir) and palladium (Pd), because these metals facilitate selective growth of the lower electrode 13. Of these, ruthenium (Ru), tungsten (W), cobalt (Co), and platinum (Pt) are particularly preferred as the material of the lower electrode 13 of the resistance change element 1. In an example of the manufacturing method described later, the lower electrode 13 made of ruthenium (Ru) having (002) orientation is used as a film excellent in crystal conformation with the first metal wiring 31 made of copper (Cu) having (111) orientation.

When the first metal wiring 31 is made of aluminum (Al), the lower electrode 13 contains, as a main component, preferably at least one metal selected from the group consisting of tungsten (W), tantalum (Ta) and titanium (Ti), because they facilitate selective growth of the lower electrode 13.

When the first metal wiring 31 is made of silicon (Si), the lower electrode 13 contains, as a main component, preferably at least one metal selected from the group constituting of tungsten (W), tantalum (Ta), and titanium (Ti), because they facilitate selective growth of the lower electrode 13.

The upper electrode may be made of, for example, titanium (Ti), titanium nitride (TiN), aluminum (Al), nickel (Ni), copper (Cu), copper aluminum (CuAl), tantalum (Ta), tantalum nitride (TaN), zirconium (Zr), hafnium (Hf), molybdenum (Mo), ruthenium (Ru), or platinum (Pt). It may be made of a film stack of these materials. In the example of a manufacturing method described later, titanium nitride (TiN) is used.

The resistance change layer 12 is preferably a single layer film or a film stack containing at least one of titanium oxide ($TiO_2$), iron oxide (FeO), nickel oxide (NiO), zirconium oxide ($ZrO_2$), copper oxide (CuO), hafnium oxide ($HfO_2$), tantalum oxide ($Ta_2O_5$), and tungsten oxide (WO), and nitrides or silicates thereof. In the example of a manufacturing method described later, nickel oxide (NiO) is used.

Examples of the material of the first to fourth interlayer insulating films 51 to 54 include silicon oxide ($SiO_2$). Examples of the material of the first to third cap insulating films 61 to 63 include silicon nitride $SiN_x$.

Figure 6:
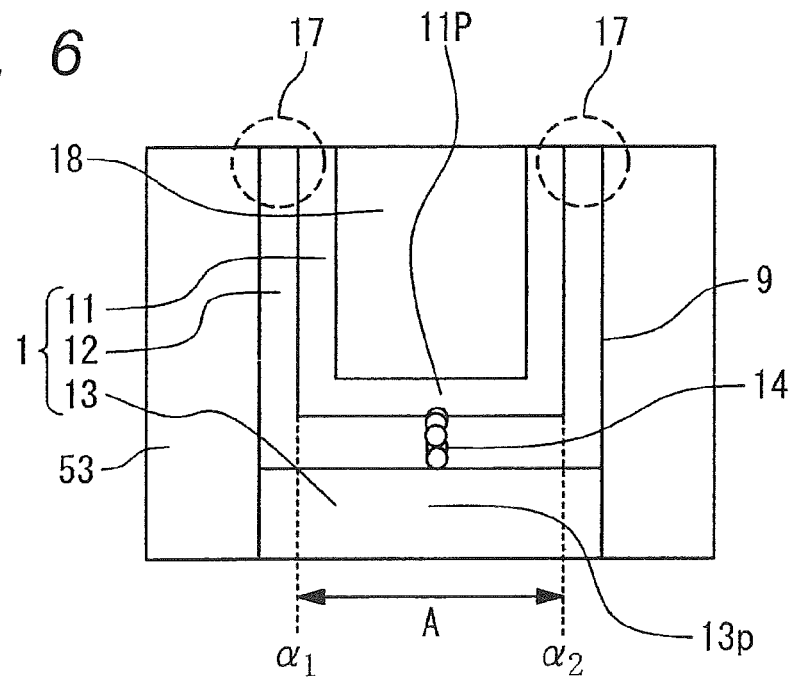
FIG. 6 is a cross-sectional view showing the configuration of the resistance change element after resistance reduction (Forming)

FIG. 6 is a cross-sectional view showing the configuration of the resistance change element after resistance reduction (Forming). It is an enlarged view of the resistance change element 1. In the resistance change element 1, a region sandwiched between the lower electrode 13 and the upper electrode 11 (an overlapped region of the lower electrode 13 and the upper electrode 11) is an effective region A in the resistance change layer 12. This effective region A is a region in which a current path 14 may be formed. In the case of FIG. 6, the upper electrode 11 and the lower electrode 13 overlap each other only partially. More specifically, only a portion 11$p$ of the upper electrode 11 overlaps with a portion 13$p$ of the lower electrode 13. This overlapped region is the effective region A (from $\alpha 1$ to $\alpha 2$) in the resistance change layer 12. As shown in this drawing, this effective region A is present only in a region at the bottom portion of the hole 9 (via hole or contact hole) from which the periphery has been removed. This means that the boundary $\alpha 1$ or $\alpha 2$ of the effective region A is distant from the side wall of the hole 9, the end portion of the lower electrode 13, the end portion of the resistance change layer 12, and the end portion of the upper electrode 11. The current path is therefore formed only in a region at the bottom portion of the hole 9 except the periphery thereof. Accordingly, the current path is free from the influence of the side wall of the hole 9, the end portion of the lower electrode 13, the end portion of the resistance change layer 12, or the end portion of the upper electrode 11. In other words, the end portion of the resistance change layer 12 lies almost on the same surface with the surface on the upper side of the third interlayer insulating film 53 and is not interposed between the upper electrode 11 and the lower electrode 13. A current path is therefore not formed at the damaged end portion 17 of the resistance change layer 12. As a result, the resulting resistance change memory has fewer variations and improved reliability.

In the present embodiment, as described above, the upper electrode 11 and the lower electrode 13 overlap only partially (effective region A). This makes it possible to decrease the capacitance of the resistance change element 1 having an MIM structure compared with that of the related-art structure. As a result, the parasitic capacitance of the bit line decreases and speed-up of write operation and read operation can be achieved.

In the present embodiment, as shown in FIG. 5, the resistance change element 1 is buried in the hole 9 and the position of the upper end of the upper electrode 11 is almost equal to the position of the lower surface of the second wiring 6. It is therefore unnecessary to form a new via or contact for coupling to the upper electrode 11. Moreover, by using the resistance change memory according to the present embodiment as shown in FIG. 5, the problem due to the height of the MIM structure upon scaling can be avoided.

Next, a method of operating the resistance change nonvolatile memory device according to the first embodiment of the invention will be described referring to FIG. 5. First, for reducing a resistance (Forming), a positive voltage is applied to the upper electrode 11 and the resistance of the resistance change layer 12 is reduced (Forming). For resistance reduction (Forming), a positive voltage may be applied to the lower electrode 13 instead of the upper electrode 11. Next, a positive voltage is applied to the upper electrode 11 upon switching from a low resistance state to a high resistance state. In this case, it is preferred to decrease the load resistance in advance so as to permit more current flow compared with the resistance reduction (Forming). In switching from a high resistance state to a low resistance state, on the other hand, a positive voltage is applied to the upper electrode 11. In this case, a voltage higher than that applied for switching to a high resistance state is applied to the upper electrode 11. As in resistance reduction (Forming), it is preferred to apply a load resistance to the resistance change element 1 in advance to prevent excessive flow of a current after the resistance reduction. Also in switching from a high resistance state to a low resistance state, a positive voltage may be applied to the lower electrode 13 instead of the upper electrode 11.

Next, a method of manufacturing the resistance change nonvolatile memory device according to the first embodiment of the invention will be described. FIGS. 7A to 7I are cross-sectional views showing a method of manufacturing the resistance change nonvolatile memory device according to the first embodiment of the invention.

Figure 7A:
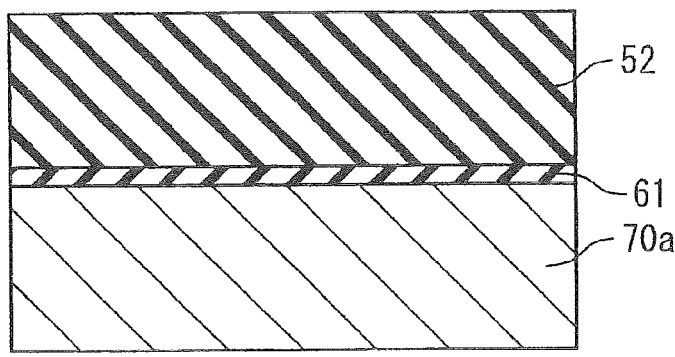
FIG. 7A is a cross-sectional view showing a method of manufacturing the resistance change nonvolatile memory device according to the first embodiment of the invention.

First, as shown in FIG. 7A, a substrate 70a is prepared. The substrate 70a is equipped with an element formed in the surface region of the semiconductor substrate and a first interlayer insulating film and a first cap insulating film 61 covering it. Next, a second interlayer insulating film 52 is formed over the substrate 70a. In the present embodiment, a silicon nitride film ($SiN_x$) is used as the first cap insulating film 61 and a silicon oxide film ($SiO_2$) is used as the first interlayer insulating film and the second interlayer insulating film 52. They are deposited by plasma CVD (Chemical Vapor Deposition).

Figure 7B:
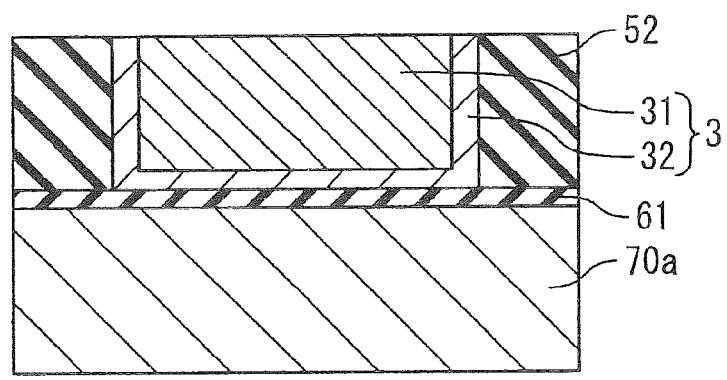
FIG. 7B is a cross-sectional view showing the method of manufacturing the resistance change nonvolatile memory device according to the first embodiment of the invention.

Next, as shown in FIG. 7B, a PR (Photoresist) step and a dry etching step are conducted to form a trench in the second interlayer insulating film 52. Then, a film for barrier metal 32 and a film for first metal wiring 31 are formed. In the present embodiment, tantalum nitride (TaN) film is used as the film for barrier metal 32 and copper (Cu) is used as the film for first metal wiring 31. The tantalum nitride film (TaN) is deposited by sputtering. Copper (Cu) is deposited by sputtering or plating. Then, a CMP (Chemical Mechanical Polishing) step is used to planarize the surface and a copper (Cu) wiring is formed as a first wiring 3.

Figure 7C:
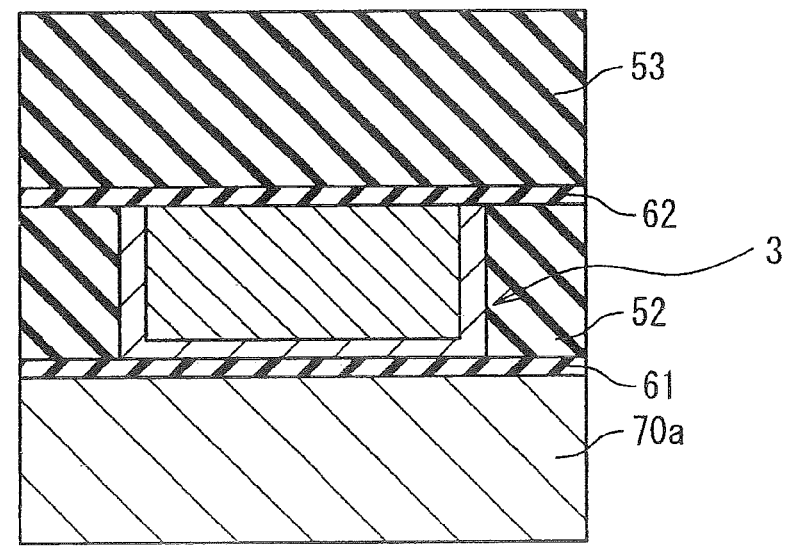
FIG. 7C is a cross-sectional view showing the method of manufacturing the resistance change nonvolatile memory device according to the first embodiment of the invention.

Next, as shown in FIG. 7C, a second cap insulating film 62 and a third interlayer insulating film 53 are formed on the surface. In this embodiment, a silicon nitride film ($SiN_x$) is used as the second cap insulating film 62 and a silicon oxide film ($SiO_2$) is used as the third interlayer insulating film 53. Each of the films is deposited by plasma CVD (Chemical Vapor Deposition).

Figure 7D:
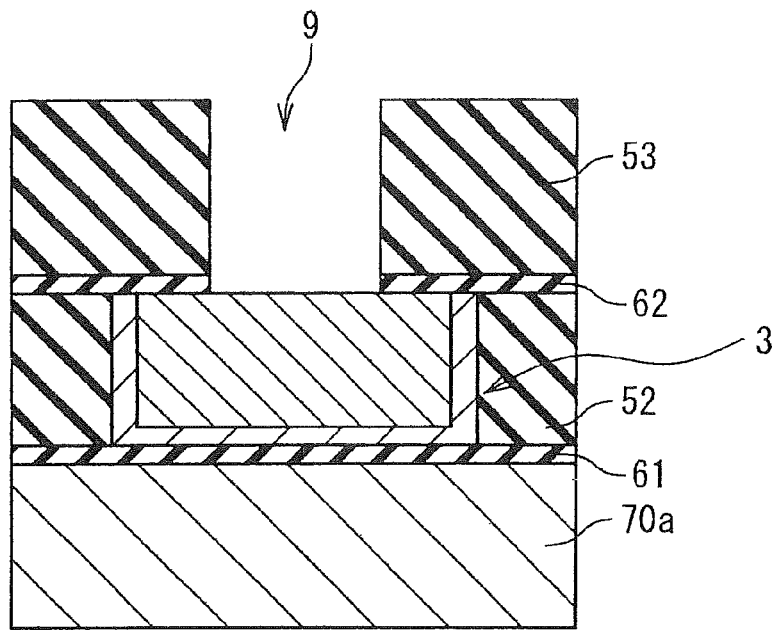
FIG. 7D is a cross-sectional view showing the method of manufacturing the resistance change nonvolatile memory device according to the first embodiment of the invention.

Then, as shown in FIG. 7D, a PR step and a dry etching step are employed to provide a hole (opening portion) 9 in the third interlayer insulating film 53 and the second cap insulating film 62. From the hole, the surface of the first wiring 3 (Cu wiring) is exposed. This means that copper (Cu) of the first wiring 3 is exposed.

Figure 7E:
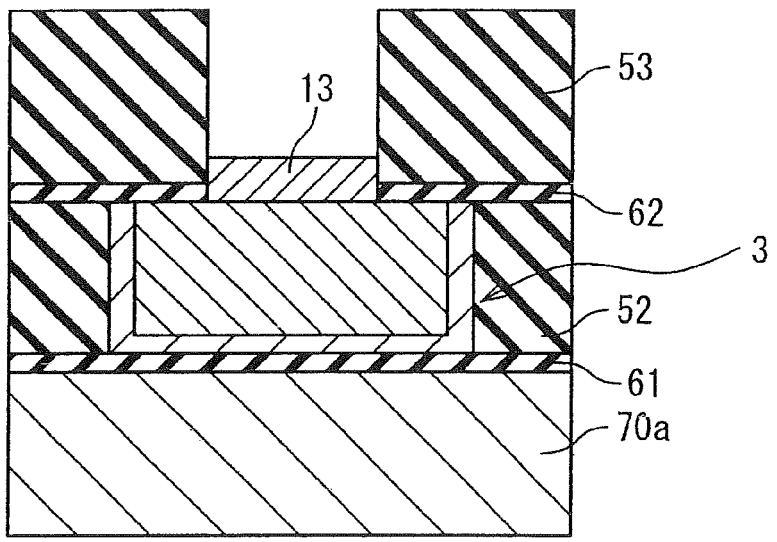
FIG. 7E is a cross-sectional view showing the method of manufacturing the resistance change nonvolatile memory device according to the first embodiment of the invention.

Next, as shown in FIG. 7E, a predetermined thickness of ruthenium (Ru) is formed on the copper (Cu) exposed portion of the hole 9 by selective CVD. This means that ruthenium (Ru) is selectively grown on the bottom portion of the hole 9 while being brought into contact with the first wiring 3. Described specifically, it can be formed, for example, by thermal CVD (example: CO gas as a process gas) using an organic metal compound of ruthenium (example: $Ru_3(CO)_{12}$). This ruthenium (Ru) becomes the lower electrode 13. This lower electrode 13 is present only on the bottom portion of the hole 9 and the end portion of it is brought into contact with the inner side wall of the hole 9.

When another metal, for example, at least one metal selected from the group consisting of tungsten (W), cobalt (Co), platinum (Pt), gold (Au), rhodium (Rh), iridium (Ir), and palladium (Pd) is used as the lower electrode 13, it can also be formed by thermal CVD using an organic metal compound containing the metal.

When an aluminum (Al) wiring (or a titanium nitride (TiN)/aluminum (Al) stacked wiring) or silicon (Si) substrate (example: source/drain) is used as the first wiring 3 and any one of tungsten (W), tantalum (Ta), and titanium (Ti) is used as the lower electrode 13, for example, the following method can be used. Described specifically, the lower electrode 13 is formed by thermal CVD using, as raw material gases, tungsten hexafluoride, tantalum pentafluoride, and titanium tetrachloride, respectively.

Figure 7F:
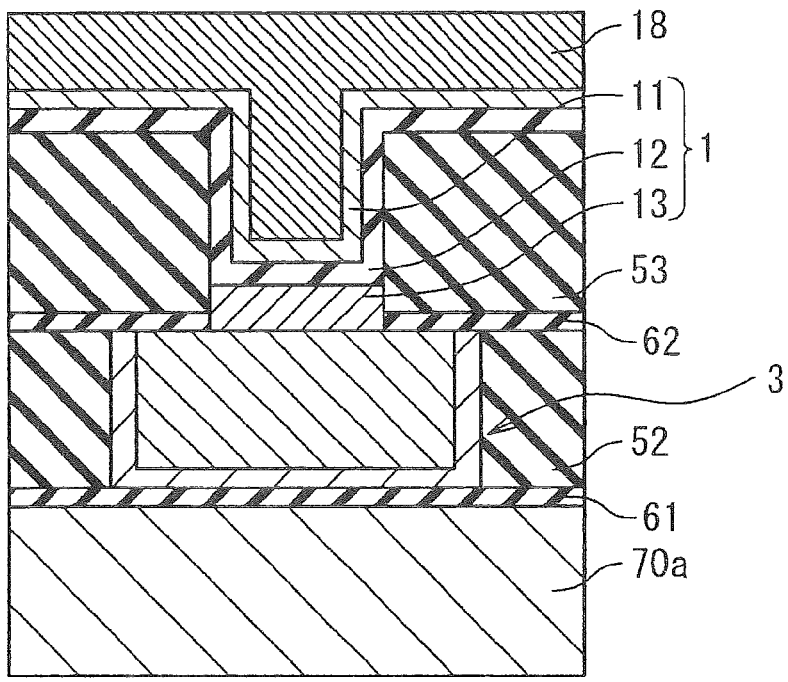
FIG. 7F is a cross-sectional view showing the method of manufacturing the resistance change nonvolatile memory device according to the first embodiment of the invention.

Then, as shown in FIG. 7F, a film for a resistance change layer 12, a film for an upper electrode 11, and a film for a buried layer 18 are formed so as to cover therewith the surface of the third interlayer insulating film 53, the inner side wall of the hole 9, and the surface of the lower electrode 13. In the present embodiment, a nickel oxide film (NiO) is used as the film for a resistance change layer 12; a titanium nitride (TiN) film is used as the film for an upper electrode 13; and tungsten (W) is used as the film for a buried layer 18. These films are formed by sputtering. The material of the buried layer 18 may be the same as that of the upper electrode 11 or alternatively, the buried layer 18 may be omitted by forming a thick film for the upper electrode 11.

Figure 7G:
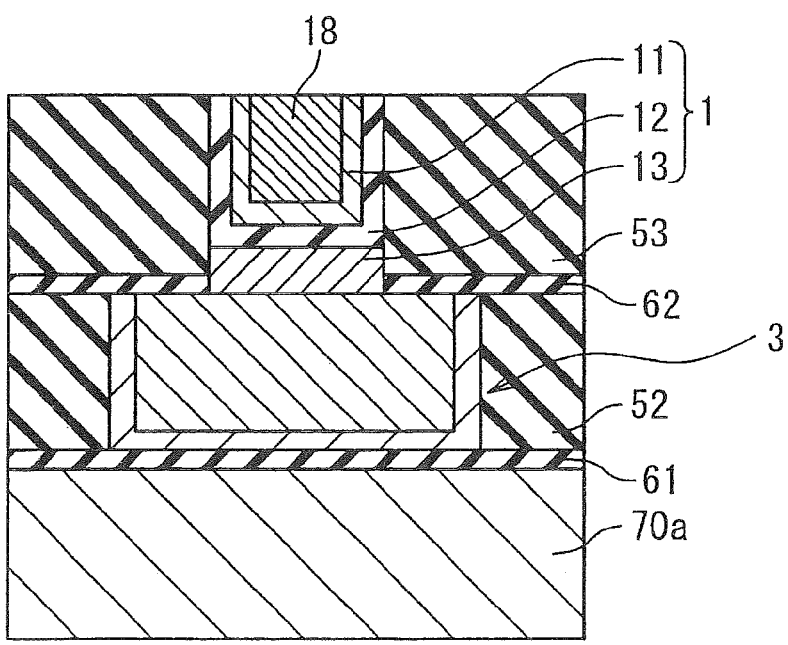
FIG. 7G is a cross-sectional view showing the method of manufacturing the resistance change nonvolatile memory device according to the first embodiment of the invention.

Then, as shown in FIG. 7G, the surface is planarized by a CMP step. As a result, the resistance change element 1 is entirely buried in the hole 9 (opening portion). At this time, the lower electrode 13 is formed only on the bottom portion of the hole 9. The resistance change layer 12 is formed on the lower electrode 13 and on the side wall of the hole 9. The end portion of the resistance change layer reaches the upper portion of the hole 9. The upper electrode 11 is formed so as to cover the inner surface of the resistance change layer 12. The end portion of the upper electrode reaches the upper portion of the hole 9.

Figure 7H:
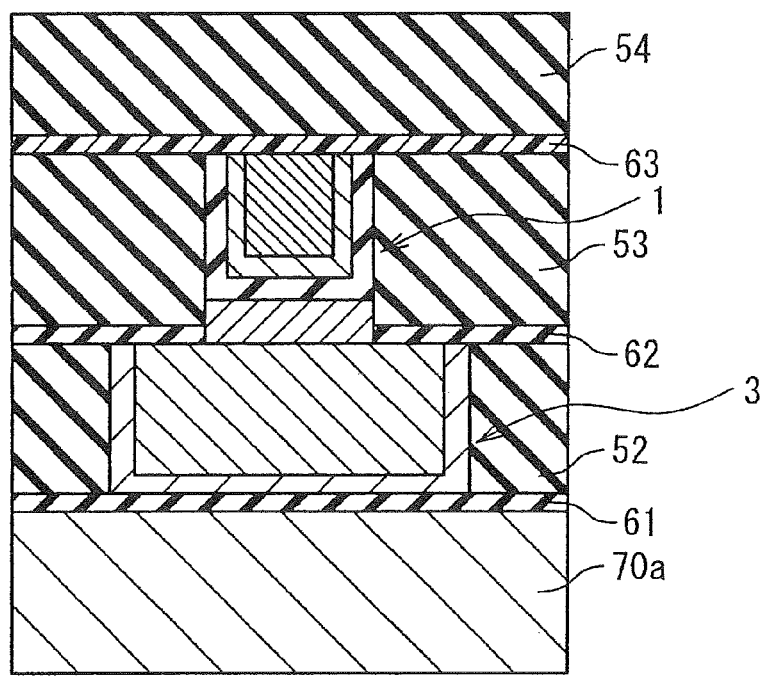
FIG. 7H is a cross-sectional view showing the method of manufacturing the resistance change nonvolatile memory device according to the first embodiment of the invention.

Next, as shown in FIG. 7H, a third cap insulating film 63 and a fourth interlayer insulating film 54 are formed on the surface. In the present embodiment, a silicon nitride film ($SiN_x$) is used as the third cap insulating film 6 and a silicon oxide film ($SiO_2$) is used as the fourth interlayer insulating film 54. These films are deposited by plasma CVD.

Figure 7I:
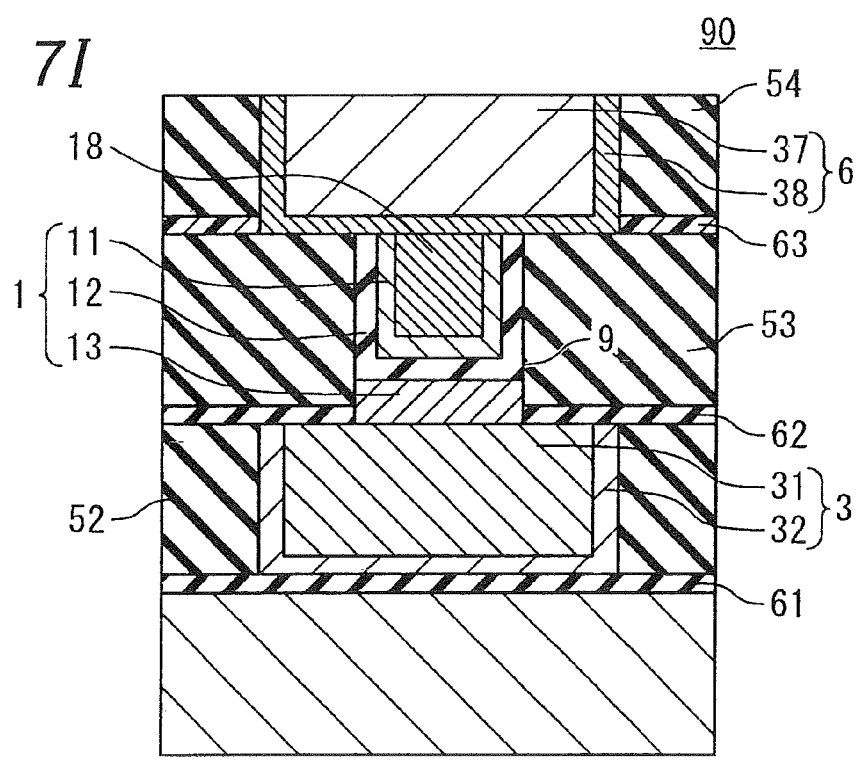
FIG. 7I is a cross-sectional view showing the method of manufacturing the resistance change nonvolatile memory device according to the first embodiment of the invention.

Next, as shown in FIG. 7I, a PR step and a dry etching step are used to form a trench in the fourth interlayer insulating film 54 and the third cap insulating film 63. From this trench, the upper electrode 11 and the buried layer 18 are exposed. Further, a film for a barrier metal layer 38 and a film for a second metal wiring 37 are formed. In the present embodiment, a tantalum nitride film (TaN) is used as the film for a barrier metal layer 38 and copper (Cu) is used as the film for a second metal wiring 37. The tantalum nitride film (TaN) is deposited by sputtering. Copper (Cu) is deposited using sputtering or plating. Then, a CMP step is conducted to planarize the surface and a copper (Cu) wiring is formed as a second wiring 6.

By the above steps, a resistance change nonvolatile memory device 90 according to the first embodiment of the invention is manufactured.

In the present embodiment, the effective area of the resistance change layer 12 is only the bottom portion (except the peripheral portion) of the hole 9 facing the lower electrode 13. The end portion of the resistance change layer 12 extends to the upper end portion of the hole 9 and is therefore distant from the bottom portion of the hole 9. Variations in the characteristics of the resistance change element 1 due to damage at the end portion of the resistance change layer 12 can therefore be reduced. In addition, since the capacitance of the resistance change element 1 depends on the diameter of the hole 9, the diameter of the hole 9 is reduced to decrease the parasitic capacitance. This enables high-speed operation of the resistance change memory. Further, in the present embodiment, a related-art MIM structure+via structure is not employed, but the resistance change element 1 is buried in the hole 9 corresponding to a via hole so that a problem due to the height of the MIM structure upon scaling can be avoided. Moreover, the resistance change nonvolatile element can be mounted along with a logic LSI (which will be described later) by adding only one PR step, which contributes to a reduction in the manufacturing cost.

(Second Embodiment) The configuration of the resistance change nonvolatile memory device according to a second embodiment of the invention will next be described referring to accompanying drawings. The second embodiment relates to a semiconductor device having both the resistance change nonvolatile memory device 90 according to the first embodiment used as a 1T1R (1 transistor 1 resistor) resistance change memory (ReRAM) and a logic LSI (large-scale integration) 91. This device will next be described in detail.

Figure 8:
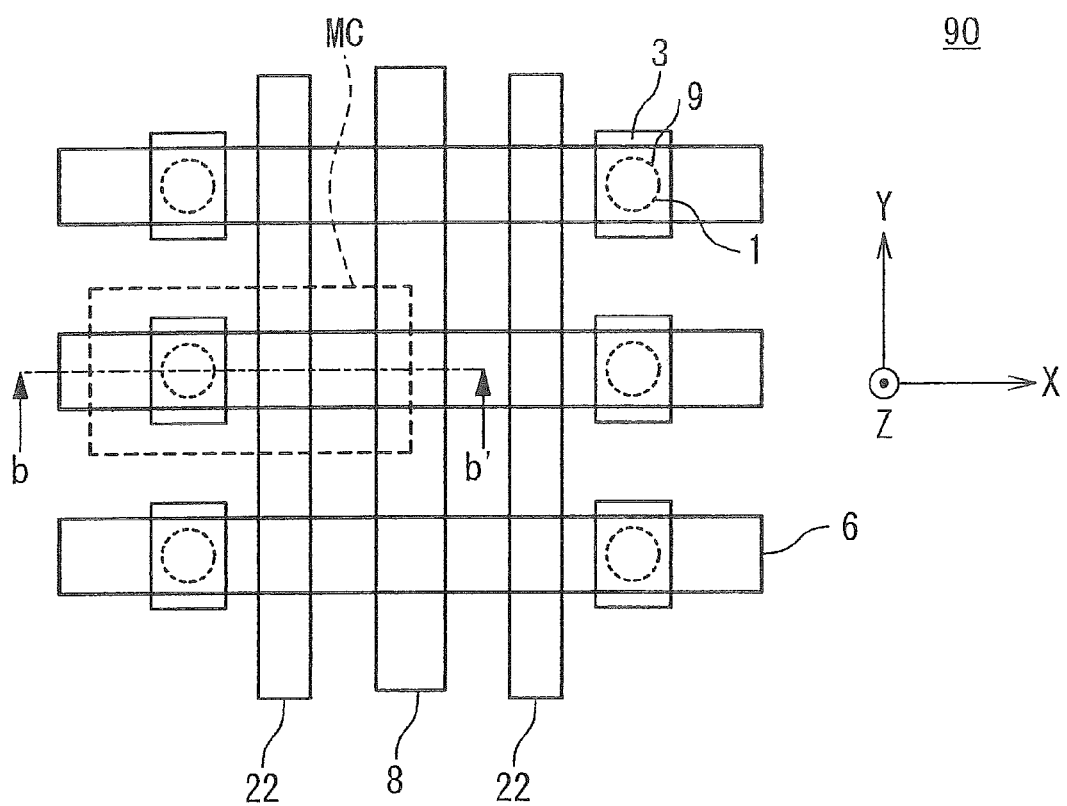
FIG. 8 is a plan view showing the configuration of a semiconductor device according to a second embodiment of the invention.

FIG. 8 is a plan view showing the configuration of the semiconductor device according to the second embodiment of the invention. This plan view however shows only a region of the resistance change nonvolatile memory device 90 (1T1R type resistance change memory) in the semiconductor device. The resistance change nonvolatile memory device 90 is equipped with a plurality of word lines (or gates) 22, a plurality of bit lines (or second wirings) 6, a plurality of common lines 8, and a plurality of memory cells MC. The word lines (gates) 22 extend in the direction Y. The bit lines (or second wirings) 6 extend in the direction X. The common lines 8 extend in the direction Y. The memory cells MC are provided, in a matrix form, at positions corresponding to intersections between the word lines 22 and the bit lines 6.

FIG. 9A is a cross-sectional view showing the configuration of the region of the resistance change nonvolatile memory device in the semiconductor device according to the second embodiment of the invention. It shows the configuration of the b-b' cross-section in FIG. 8, which corresponds to the configuration of one memory cell MC. The memory cell MC of the resistance change nonvolatile memory device 90 is equipped with a control transistor 2 and a resistance change element 1. In a region surrounded with an element isolation region 71, the control transistor 2 is formed on a semiconductor substrate 70. The control transistor 2 is equipped with a gate insulating film 23, a gate 22 (word line), a drain 21, a source 24, and a sidewall 25. Contacts 4 are coupled to the drain 21 and the source 24, respectively. The control transistor 2 and the contacts 4 are covered with a first interlayer insulating film 51 and a first cap insulating film 61. The contact 4 on the side of the drain 21 is coupled to a first wiring 3 made of a barrier metal layer 32 and a first metal wiring 31. The first wiring 3 is covered, on the side surface and upper surface thereof, with a second interlayer insulating film 52 and a second cap insulating film 62. The resistance change element 1 of the resistance change memory is coupled to the first wiring 3 via an opening portion of the second cap insulating film 62. The resistance change element 1 has an MIM structure (Metal/Insulator/Metal) having a lower electrode 13 to be coupled to the first wiring 3, a resistance change layer 12 on the lower electrode 13, and an upper electrode 11 on the resistance change layer 12. The upper electrode 11 may have, inside thereof, a buried layer 18. The upper electrode 11 (and the buried layer 18) is coupled to a second wiring 6 (bit line) made of a barrier metal layer 38 and a second metal wiring 37. The contact on the side of the source 24 is coupled to the common line 8 via an opening portion of the first cap insulating film 61. The resistance change element 1 is covered, on the side surface thereof, a third interlayer insulating film 53 and a third cap insulating film 63. The second wiring 6 is provided on the third interlayer insulating film 53. The second wiring 6 is covered, on the side surface thereof, with a fourth interlayer insulating film 54. In the present embodiment, as shown in FIG. 9A, the resistance change element 1 is formed in the hole 9 provided between wiring layers (here, between the wiring layer of the first wiring 3 and the wiring layer of the second wiring 6). The resistance change element 1 has an MIM capacitor structure isolated from the resistance change element 1 of an adjacent memory cell MC.

On the other hand, the following is the region of a logic LSI 91 in the semiconductor device. FIG. 9B is a cross-sectional view showing the configuration of the region of the logic LSI region in the semiconductor device according to the second embodiment of the invention. In this drawing, a region of the logic LSI 91 including one transistor is shown. In the region surrounded with an element isolation region 71a, a control transistor 2a is formed on the semiconductor substrate 70. The control transistor 2a is equipped with a gate insulating film 23a, a gate 22a, a drain 21a, a source 24a, and a sidewall 25a. Contacts 4a are coupled to the drain 21a and the source 24a, respectively. The control transistor 2a and the contacts 4a are covered with the first interlayer insulating film 51 and the first cap insulating film 61. The contact 4a on the side of the drain 21a is coupled to a first wiring 3a composed of a barrier metal layer 32a and a first metal wiring 31a via an opening portion of the first cap insulating film 61. The first wiring 3a is covered, on the side surface and the upper surface thereof, with the second interlayer insulating film 52 and the second cap insulating film 62. The first wiring 3a is coupled to a via 5a composed of a barrier metal layer 35a and a via metal 34a through an opening portion of the second cap insulating film 62. The via 5a is covered, on the side surface thereof, with the third interlayer insulating film 53 and the third cap insulating film 63. The via 5a is coupled to a second wiring 6a composed of a barrier metal layer 38a and a second metal wiring 37a via an opening portion of the third cap insulating film 63. The second wiring 6a is provided on the third cap insulating film 63. The second wiring 6a is covered, on the side surface thereof, with a fourth interlayer insulating film 54. The contact coupled to the source 24a is similar to it. As shown in FIG. 9A and FIG. 9B, the surface region of the substrate 70 and the role of each layer are not different between the region of the resistance change memory and the region of the logic LSI.

In the case of FIG. 9A, the resistance change element 1 is formed between the wiring layer (first-level wiring layer) having therein the first wiring 3 and the wiring layer (second-level wiring layer) having therein the second wiring 6. Instead, the resistance change element 1 may be formed between other two wiring layers adjacent to each other. Or, the resistance change element 1 may be formed between two wiring layers not adjacent to each other (example: between the first-level wiring layer and the third-level wiring layer). The resistance change element 1 may be formed in the contact 4.

Other configurations and functions of the first wiring 3, the resistance change element 1, and the second wiring 6 in the present embodiment are similar to those of the first embodiment.

In the present embodiment, the resistance change element 1 is buried in the hole 9 corresponding to the via hole in the logic LSI region. In addition, the uppermost position of the upper electrode 11 is equal to the position of the lower surface of the second wiring 6 so that a new via for coupling the upper electrode 11 and the second wiring 6 is not necessary. Moreover, by using the resistance change memory of the present embodiment as shown in FIG. 9A, a problem due to the height of the MIM structure in scaling can be avoided. In addition, the structure of the resistance change memory of the present embodiment does not affect the structure of the region of the logic LSI. Therefore, it is effective for mounting with a logic device.

Further, as shown in FIG. 6 of the first embodiment, a region interposed between the lower electrode 13 and the upper electrode 11 becomes an effective region A in the resistance change layer 12. The upper electrode 11 and the lower electrode 13 overlap only partially so that compared with the related-art structure, the capacitance of the resistance change element 1 can be decreased. This results in a decrease in a parasitic capacitance of a bit line (second wiring 6) and speed-up of write/read operation.

The boundary of the effective region A does not reach the side wall of the hole 9, the end portion of the lower electrode 13, or the end portion of the upper electrode 11. A current path therefore appears only in a region at the bottom portion of the hole 9 except the periphery. The current path is therefore not affected by the side wall of the hole 9, the end portion of the lower electrode 13, or the end portion of the upper electrode 11. In other words, an incomplete current path is not formed at the damaged end portion 17 of the resistance change layer 12. As a result, the resistance change memory has reduced variations and improved reliability.

A method of operating the resistance change nonvolatile memory device of the semiconductor device according to the second embodiment of the invention is similar to that of the first embodiment.

Next, a method of manufacturing the semiconductor device according to the second embodiment of the invention will be described. FIGS. 10A and 10B to FIGS. 15A and 15B are cross-sectional views showing the method of manufacturing the semiconductor device according to the second embodiment of the invention, in which FIG. nA (n represents an integer from 10 to 15) is a region of the resistance change nonvolatile memory device 90 (which may also be called "memory portion" hereinafter) and FIG. nB is a region of the logic LSI 91 (which may also be called "logic portion" hereinafter).

Figure 10A:
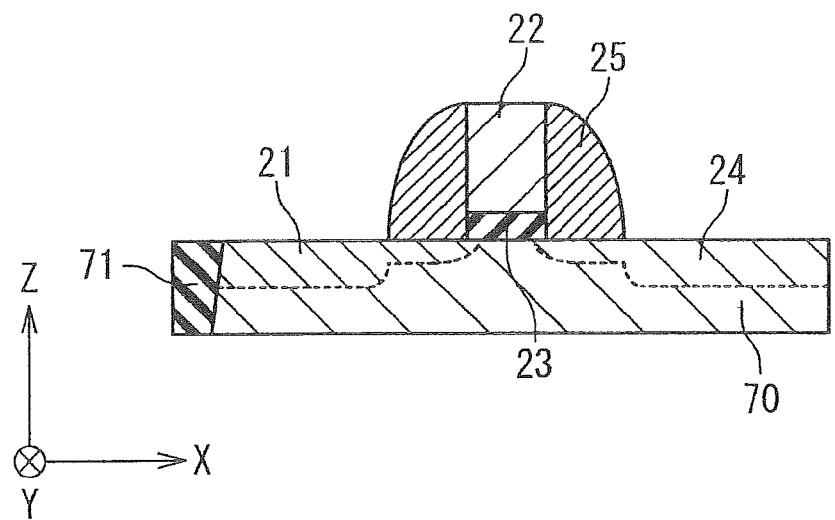
FIG. 10A is a cross-sectional view showing a method of manufacturing the semiconductor device according to the second embodiment of the invention.
Figure 10B:
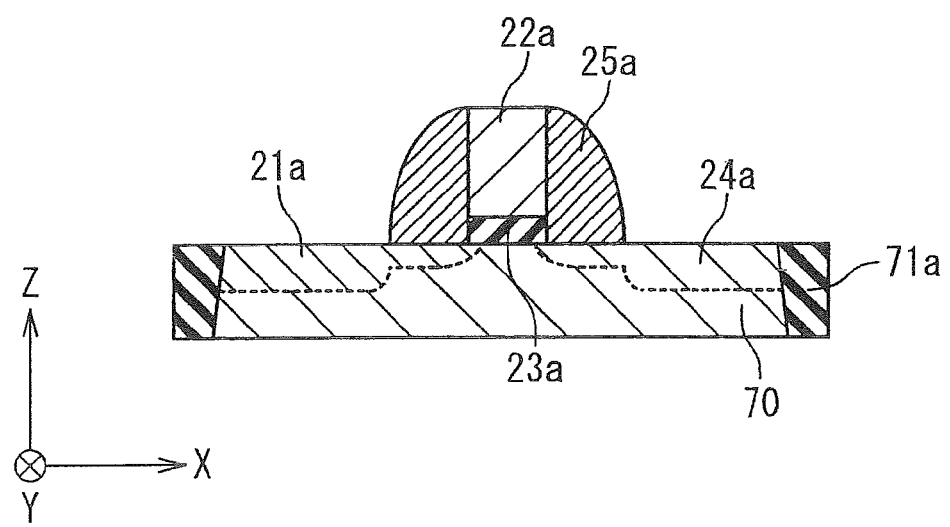
FIG. 10B is a cross-sectional view showing a method of manufacturing the semiconductor device according to the second embodiment of the invention.

First, in the memory portion and the logic portion as shown in FIG. 10A and FIG. 10B, element isolation layers 71 and 71a, gates 22 and 22a, gate insulating films 23 and 23a, sources 24 and 24a, drains 21 and 21a, and side walls 25 and 25a are formed on a semiconductor substrate 70 by using a typical MOSFET step. In this embodiment, p-silicon (Si) is used as the semiconductor substrate 70, a silicon oxide film ($SiO_x$) is used as the gate insulating films 23 and 23a, a polysilicon film (poly-Si) is used as the gates 22 and 22a, n+ silicon (n+Si) is used as the sources 24 and 24a and the drains 21 and 21a, and a silicon nitride film ($SiN_x$) is used as the side walls 25 and 25a.

Figure 11A:
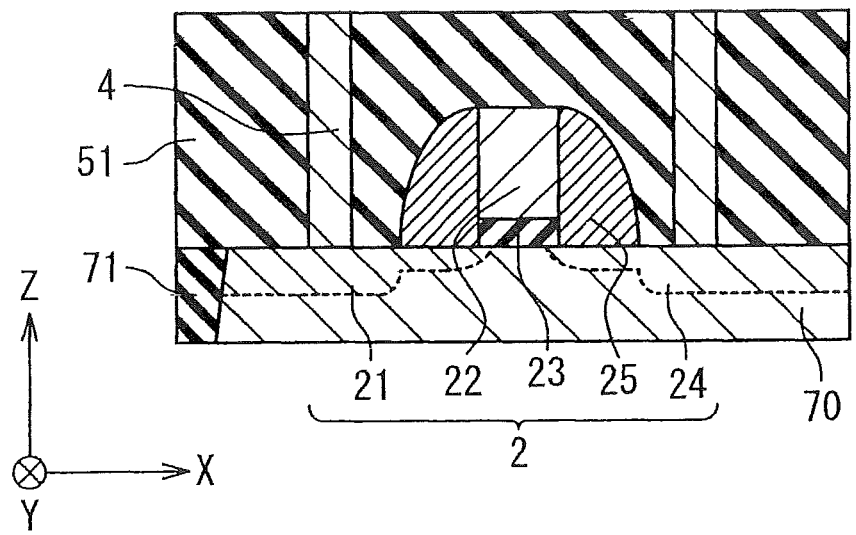
FIG. 11A is a cross-sectional view showing the method of manufacturing the semiconductor device according to the second embodiment of the invention.
Figure 11B:
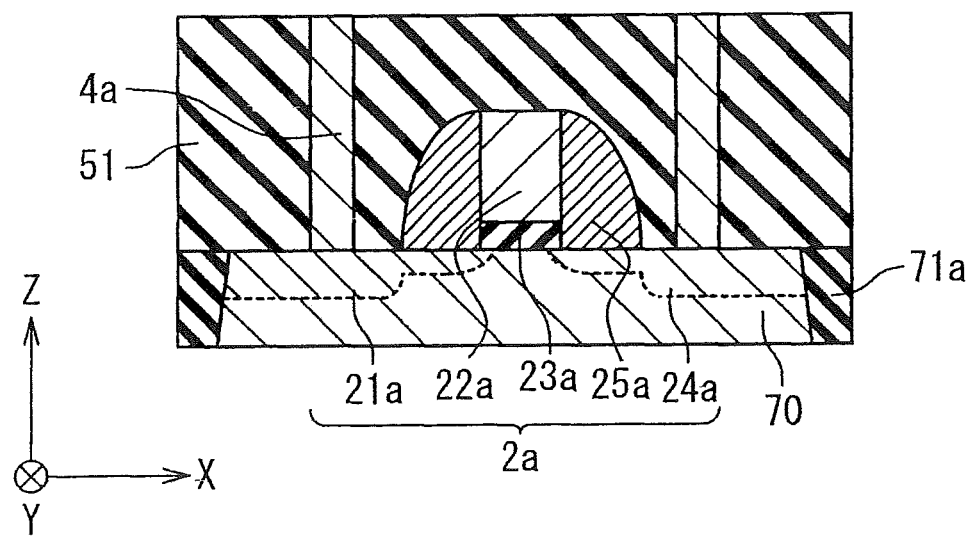
FIG. 11B is a cross-sectional view showing the method of manufacturing the semiconductor device according to the second embodiment of the invention.

Next, as shown in FIG. 11A and FIG. 11B, in the memory portion and the logic portion, a film for a first interlayer insulating film 51 is deposited on the entire surface, followed by planarization by using a CMP step to form the first interlayer insulating film 51. In the present embodiment, a silicon oxide film (SiOx) is used as the first interlayer insulating film 53 and it is deposited using plasma CVD. Then, a PR step and a dry etching step are conducted to provide opening portions in the first interlayer insulating film 51. Contacts 4 and 4a buried in the openings are coupled to the sources 24 and 24a and the drains 21 and 21a, respectively. These contacts 4 and 4a are formed by sputtering while using tungsten (W).

Figure 12A:
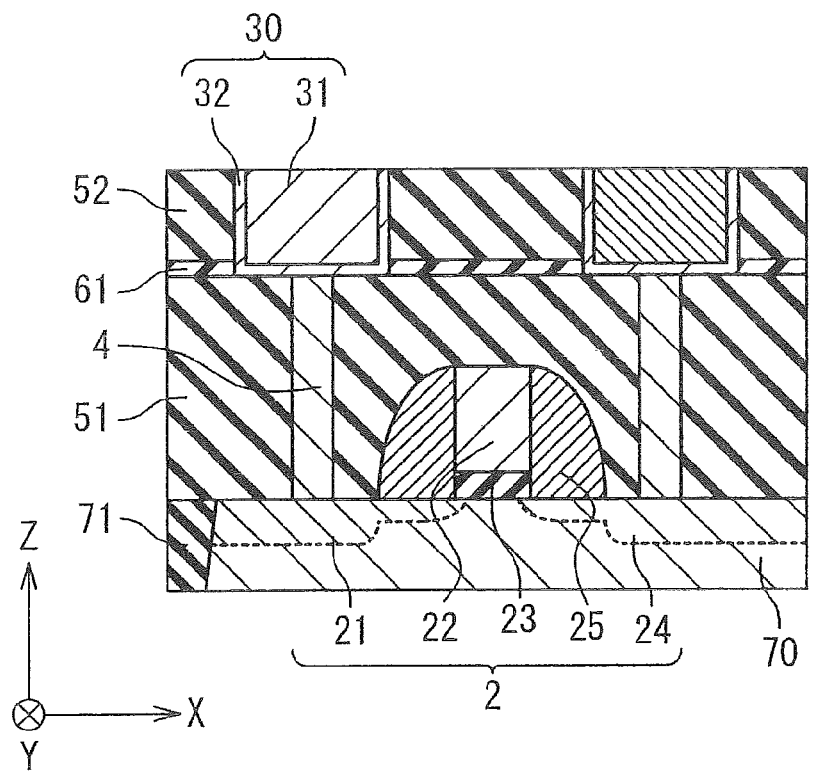
FIG. 12A is a cross-sectional view showing the method of manufacturing the semiconductor device according to the second embodiment of the invention.
Figure 12B:
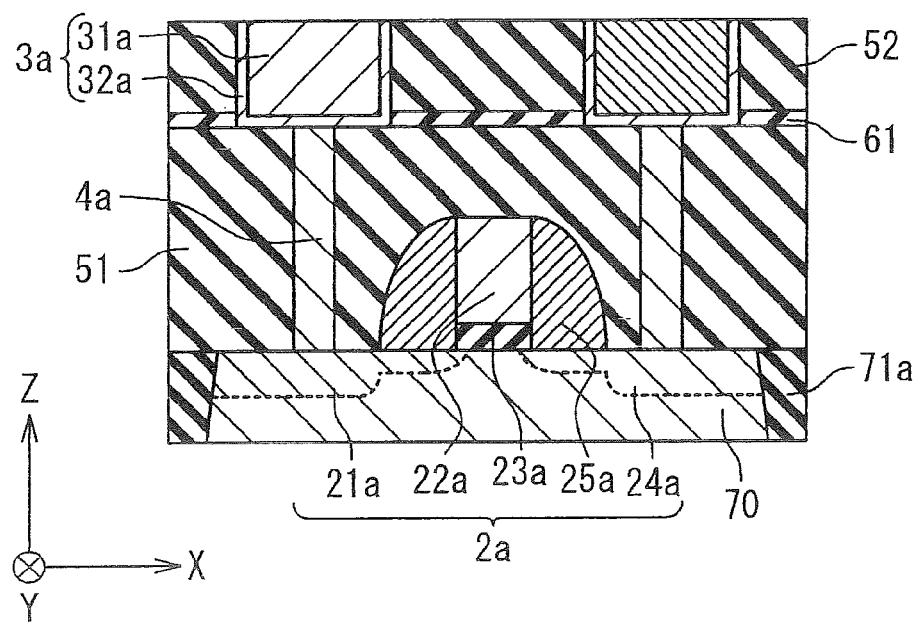
FIG. 12B is a cross-sectional view showing the method of manufacturing the semiconductor device according to the second embodiment of the invention.

Next, as shown in FIG. 12A and FIG. 12B, in the memory portion and the logic portion, a first cap insulating film 61 and a second interlayer insulating film 52 are deposited on the entire surface. In the present embodiment, a silicon nitride film ($SiN_x$) is used as the first cap insulating film 61 and a silicon oxide film ($SiO_x$) is used as the second interlayer insulating film 52. Then, a PR step and a dry etching step are conducted to form a trench in the second interlayer insulating film 52 and the first cap insulating film 61. Then, a film for barrier metal layers 32 and 32a and a film for first metal wirings 31 and 31a are deposited. In the present embodiment, a tantalum nitride film (TaN) is used as the film for barrier metal layers 32 and 32a and it is formed by sputtering, while copper (Cu) is used as the film for first metal wirings 31 and 31a and it is formed by sputtering and plating. Further, a CMP step is conducted to planarize the surface and a first wiring 3 (32+31) and a first wiring 3a (32a+31a) are formed.

Figure 13A:
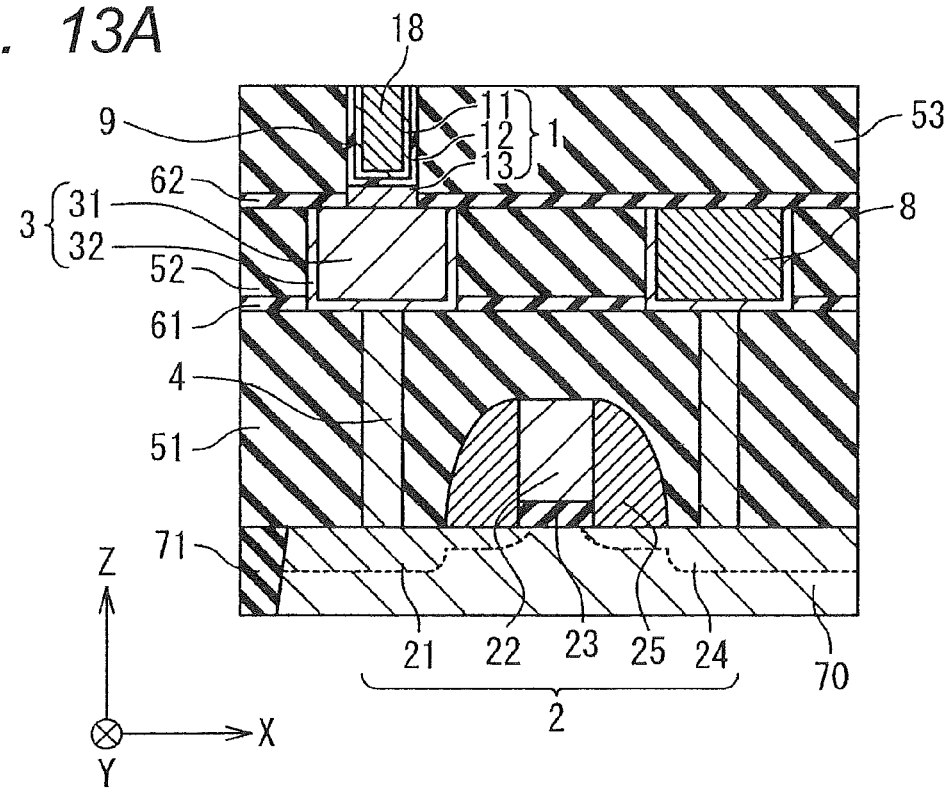
FIG. 13A is a cross-sectional view showing the method of manufacturing the semiconductor device according to the second embodiment of the invention.
Figure 13B:
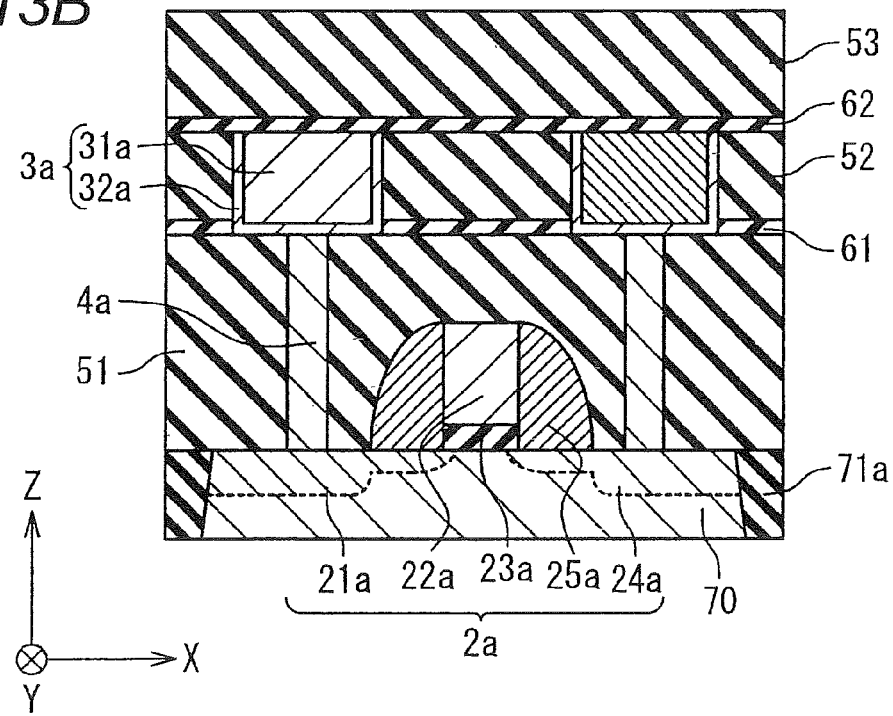
FIG. 13B is a cross-sectional view showing the method of manufacturing the semiconductor device according to the second embodiment of the invention.

Next, as shown in FIG. 13A and FIG. 13B, in the memory portion and the logic portion, a second cap insulating film 62 and a third interlayer insulating film 53 are deposited on the entire surface. In the present embodiment, a silicon nitride ($SiN_x$) film is used as the second cap insulating film 62 and a silicon oxide film ($SiO_x$) is used as the third interlayer insulating film 53. These films are deposited by plasma CVD. Further, in the memory portion, a PR step and a dry etching step are employed to provide a hole 9 (opening portion) only in predetermined regions of the third interlayer insulating film 53 and the second cap insulating film 62. From the hole, copper (Cu) on the surface of the first wiring 3 is exposed. Furthermore, ruthenium (Ru) is selectively grown on the exposed portion of copper (Cu) of the hole 9 by CVD. This ruthenium (Ru) film becomes a lower electrode 13. Next, a film for resistance change layer 12, a film for upper electrode 11, and a film for buried layer 18 are deposited on the entire surface. In the present embodiment, a film stack of $TiO_2$ and $Ta_2O_5$ is used as the film for resistance change layer 12; a titanium nitride film (TiN) is used as the film for upper electrode 11; and tungsten (W) is used as the film for buried layer 18. The film for buried layer 18 may be made of the same material as that of the film for upper electrode 11. Alternatively, the buried layer may be omitted. Next, the surface is planarized using CMP, by which a configuration of the hole 9 filled with a resistance change element 1 (the lower electrode 13, the resistance change layer 12, and the upper electrode 11) is formed in the memory portion.

Figure 14A:
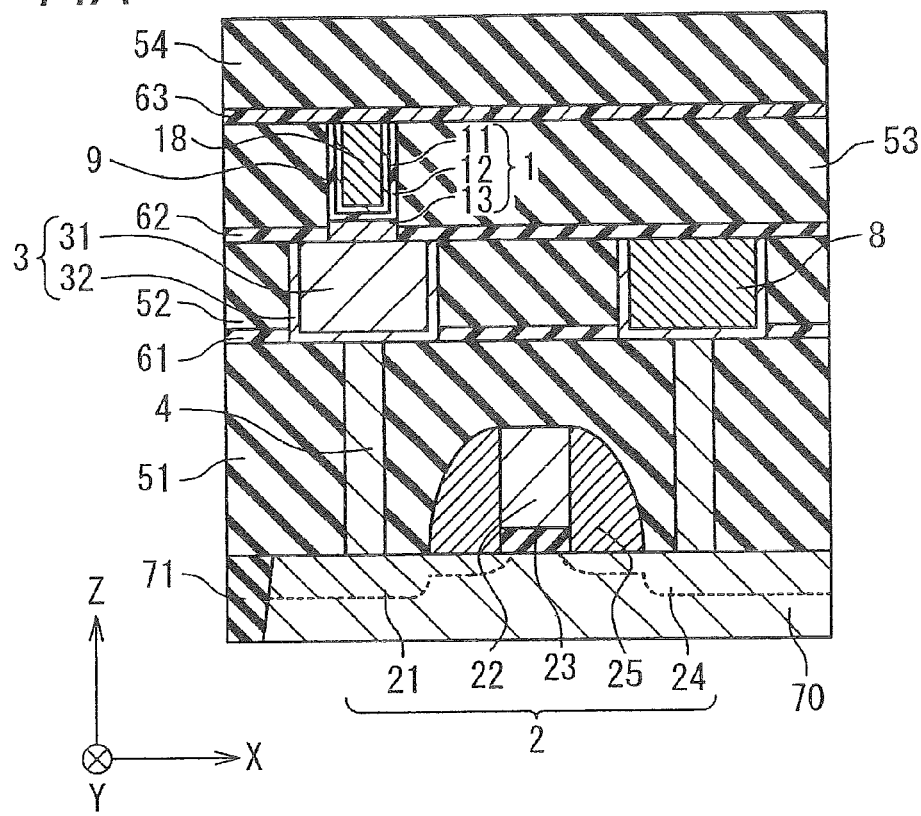
FIG. 14A is a cross-sectional view showing the method of manufacturing the semiconductor device according to the second embodiment of the invention.
Figure 14B:
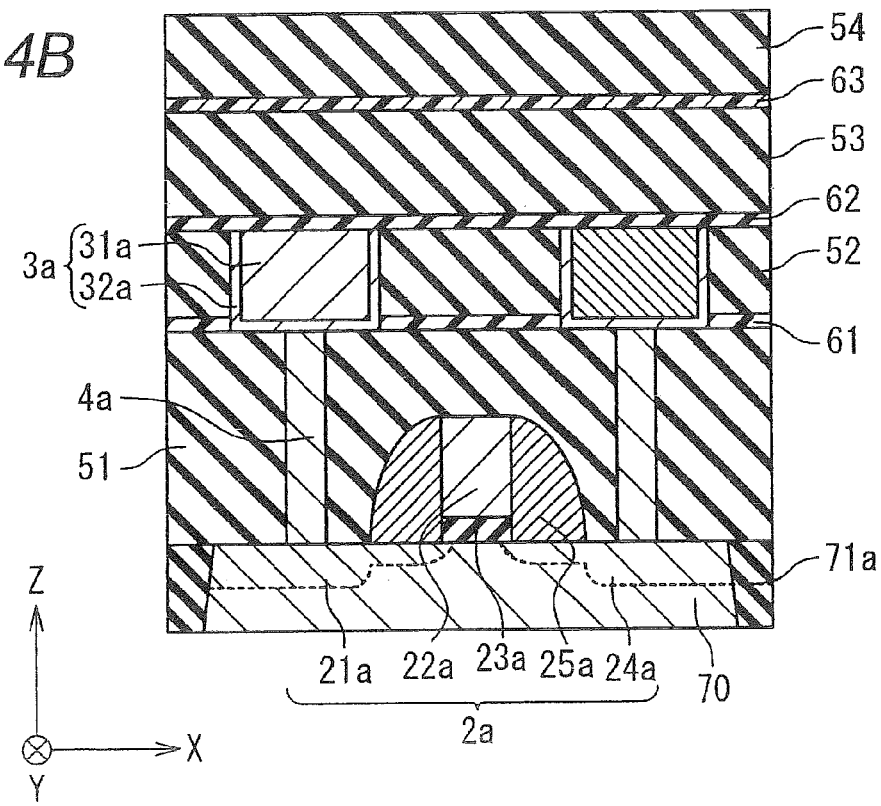
FIG. 14B is a cross-sectional view showing the method of manufacturing the semiconductor device according to the second embodiment of the invention.

Next, as shown in FIG. 14A and FIG. 14B, in the memory portion and the logic portion, a third cap insulating film 63 and a fourth interlayer insulating film 54 are deposited on the entire surface. In the present embodiment, a silicon nitride film (SiNx) is used as the third cap insulating film 63 and a silicon oxide film (SiOx) is used as the fourth interlayer insulating film 54. They are deposited using plasma CVD.

Figure 15A:
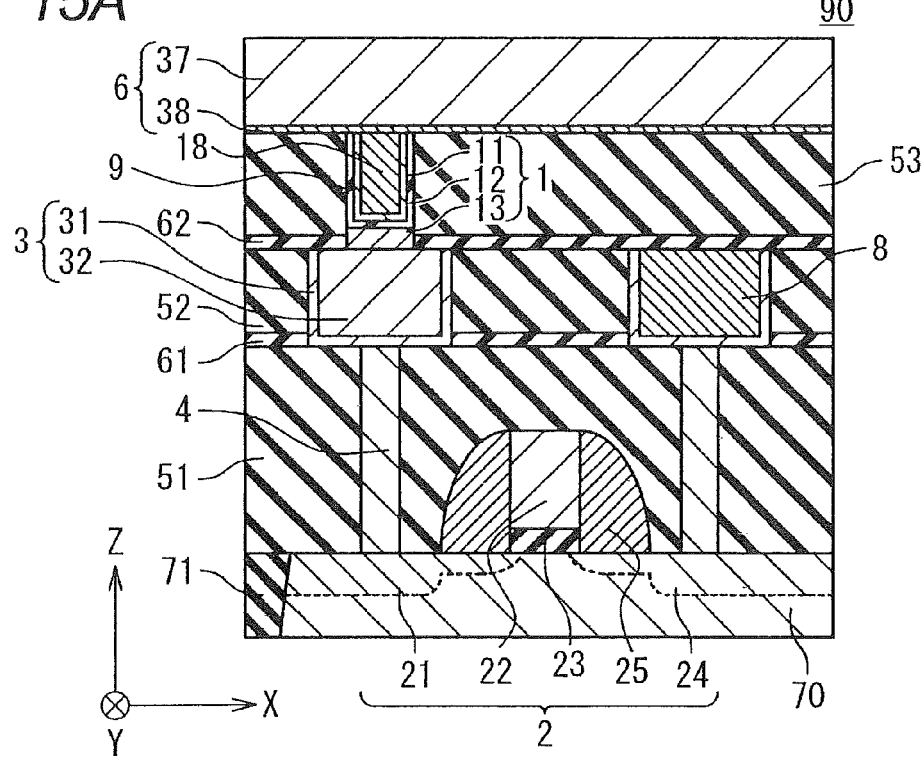
FIG. 15A is a cross-sectional view showing the method of manufacturing the semiconductor device according to the second embodiment of the invention.
Figure 15B:
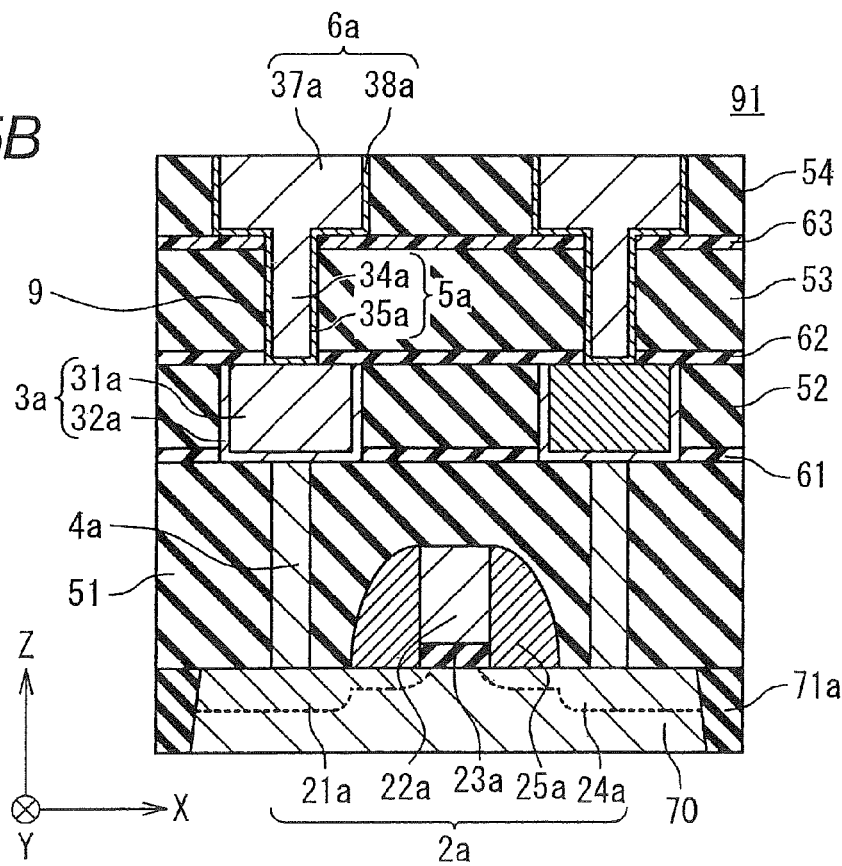
FIG. 15B is a cross-sectional view showing the method of manufacturing the semiconductor device according to the second embodiment of the invention.

Next, as shown in FIG. 15A and FIG. 15B, a PR step and a dry etching step are conducted to form a trench in the fourth interlayer insulating film 54 and the third cap insulating film 63 in the memory portion and in the logic portion, a trench in the fourth interlayer insulating film 54 and a via hole in the third cap insulating film 63, the third interlayer insulating film 53, and the second cap insulating film 62. As a result, the upper electrode 11 (and buried layer 18) is exposed in the memory portion, while the first wiring 3a is exposed in the logic portion. Then, a film for barrier metal layers 38, 35a, and 38a and a film for via metal 34a and second metal wirings 37 and 37a are deposited. In the present embodiment, a tantalum nitride film (TaN) is used as the film for barrier metal layers 38, 35a, and 38a and it is formed using sputtering, while copper (Cu) is used as a film for via metal 34a and second metal wirings 37 and 37a and it is formed using sputtering and plating. Then, the surface is planarized by a CMP step to form a second wiring 6 (38+37), a via 5a (34a+35a), and a second wiring 6a (38a+37a).

In such a manner, the semiconductor device according to the second embodiment of the invention is manufactured.

The present embodiment can also produce advantages similar to those produced by the first embodiment. In addition, since the resistance change nonvolatile memory device of the present embodiment can be mounted in logic LSI by adding only one PR step, making it possible to drastically decrease a manufacturing cost. Moreover, this resistance change nonvolatile memory device can be mounted without changing the device parameter of the logic LSI.

(Third Embodiment) The configuration of a resistance change nonvolatile memory device according to the third embodiment of the invention will next be described referring to accompanying drawings. The third embodiment is different from the first embodiment in that a lower electrode 13a of a resistance change element 1a is formed not only on the bottom portion of the hole 9 but it extends from the bottom portion to a position midway of the side wall. The third embodiment will next be described in detail.

Figure 16:
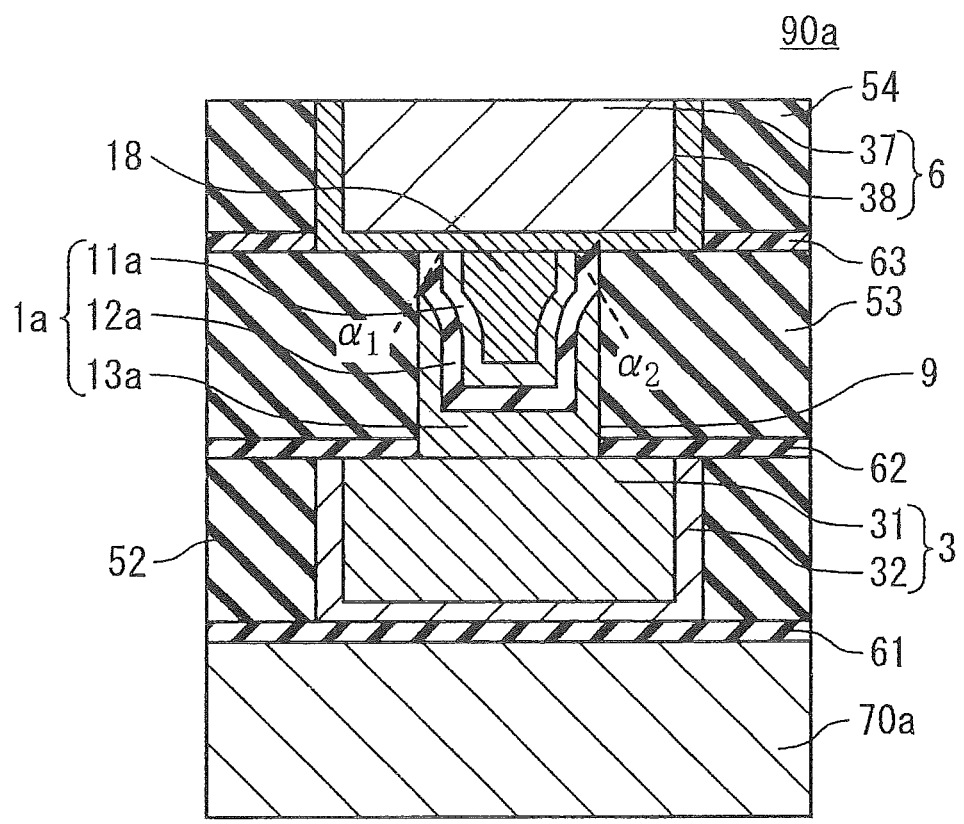
FIG. 16 is a cross-sectional view showing the configuration of the major portion of a resistance change nonvolatile memory device according to a third embodiment of the invention.

FIG. 16 is a cross-sectional view showing the configuration of the major portion of the resistance change nonvolatile memory device according to the third embodiment of the invention. The resistance change nonvolatile memory device 90a is equipped with a substrate 70a, a first cap insulating film 61, a first wiring, a second interlayer insulating film 52, a second cap insulating film 62, a resistance change element 1a, a third interlayer insulating film 53, a third cap insulating film 63, a second wiring 6, and a fourth interlayer insulating film 54.

The resistance change element 1a stores data according to a change in resistance. It is provided in a hole 9 formed between the first wiring 3 and the second wiring 6. The resistance change element 1a is equipped with a lower electrode 13a, a resistance change layer 12a, and an upper electrode 11a.

The lower electrode 13a is formed on the bottom portion of the hole 9 and in addition, extends midway of the side wall. The end portion of the lower electrode however exists on the position midway of the side wall of the hole 9 and does not reach the upper portion of the hole 9. The lower electrode 13a is made of a metal conductor. The lower electrode 13a is formed by not selective growth but a typical film formation process. The formation process of it will be described later.

The resistance change layer 12a is formed on the lower electrode 13a and on the side wall of the hole 9. The end portion of it reaches the upper portion of the hole 9. The end portion is preferably in contact with the bottom surface of the second wiring 6. If so, the end portion of the resistance change layer 12a can be separated clearly from the end portion of the lower electrode 13a. As a result, the resistance change element 1a becomes free from the influence of the end portion of the resistance change layer 12a. The resistance change layer 12a may contain an oxide using a metal material different from that used for the lower electrode 13a.

The upper electrode 11a is formed so as to cover the inner surface of the resistance change layer 12a. The end portion of the upper electrode reaches the upper portion of the hole 9. The end portion is preferably in contact with the bottom surface of the second wiring 6, because if so, it is not necessary to additionally form a via or contact for coupling the resistance change element 1a and the second wiring 6. The upper electrode 11a is made of a metal conductor. The upper electrode 11a may have a buried layer (metal) 18 for filling a region inside thereof.

Other features of the resistance change element 1a and other configurations of the resistance change nonvolatile memory device are similar to those of the first embodiment.

This embodiment can also produce advantages similar to those described in the first embodiment.

A method of operating the resistance change nonvolatile memory device according to the third embodiment of the invention is similar to that of the first embodiment.

Next, a method of manufacturing the resistance change nonvolatile memory device according to the third embodiment of the invention will be described. FIG. 17A to FIG. 17F are cross-sectional views showing the method of manufacturing the resistance change nonvolatile memory device according to the third embodiment of the invention.

Figure 17A:
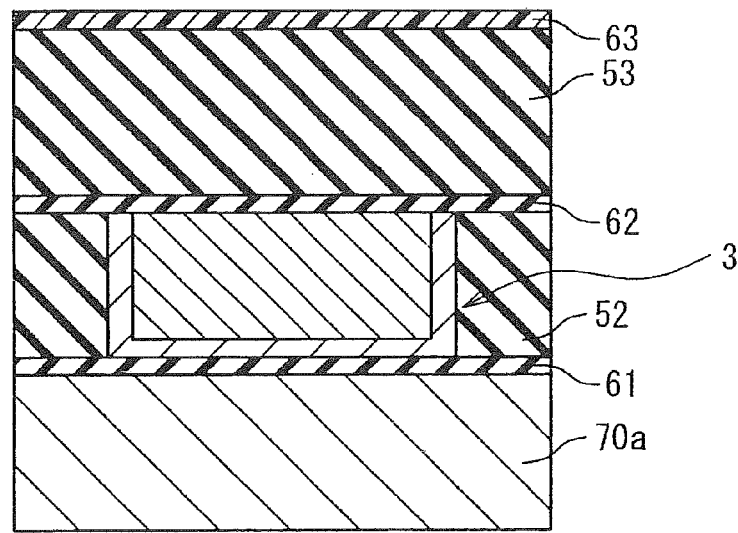
FIG. 17A is a cross-sectional view showing a method of manufacturing the resistance change nonvolatile memory device according to the third embodiment of the invention.

First, the steps shown in FIG. 7A and FIG. 7B of the first embodiment are conducted. Next, as shown in FIG. 17A, a second cap insulating film 62, a third interlayer insulating film 53, and a third cap insulating film 63 are formed on the surface. In the present embodiment, a silicon nitride film ($SiN_x$) is used as the second cap insulating film 62 and the third cap insulating film 63 and a silicon oxide film ($SiO_2$) is used as the third interlayer insulating film 53. These films are deposited using plasma CVD.

Figure 17B:
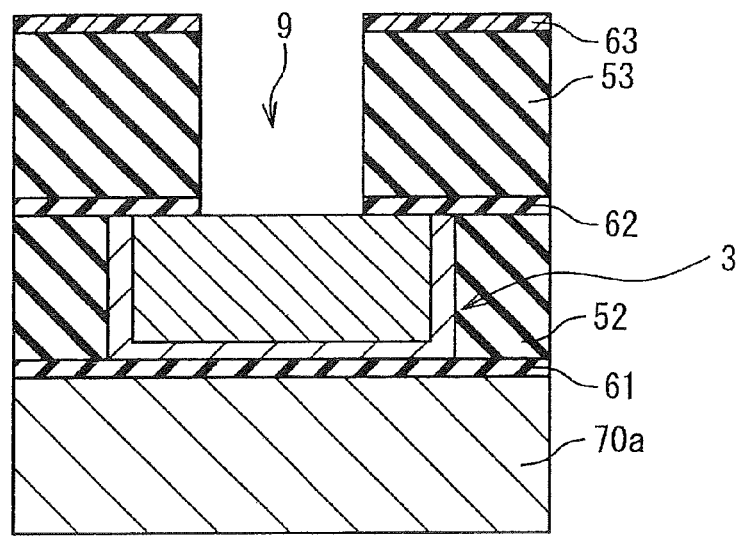
FIG. 17B is a cross-sectional view showing the method of manufacturing the resistance change nonvolatile memory device according to the third embodiment of the invention.

Next, as shown in FIG. 17B, a PR step and a dry etching are conducted to provide a hole (opening portion) 9 in the third cap insulating film 63, the third interlayer insulating film 53, and the second cap insulating film 62, by which the surface of the first wiring 3 is exposed. This means that copper (Cu) of the first wiring 3 is exposed.

Figure 17C:
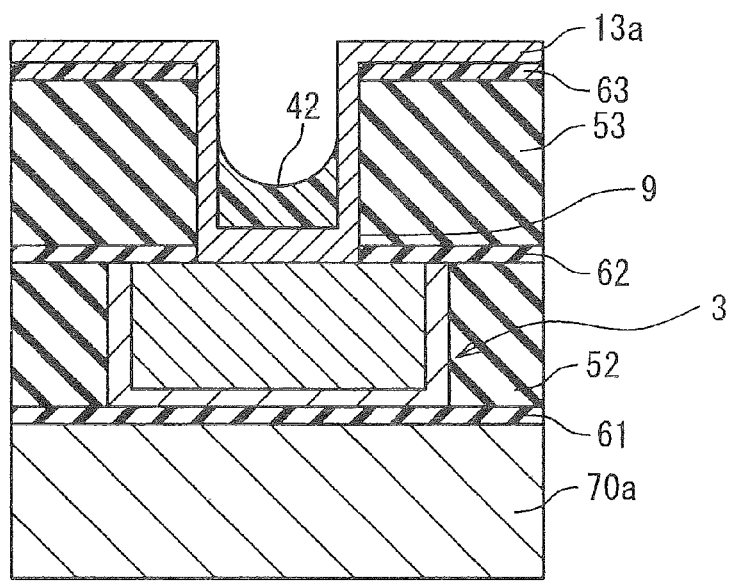
FIG. 17C is a cross-sectional view showing the method of manufacturing the resistance change nonvolatile memory device according to the third embodiment of the invention.

Then, as shown in FIG. 17C, a film for a lower electrode 13a is formed on the entire surface. In the present embodiment, ruthenium (Ru) is used as the film for lower electrode 13a. The ruthenium (Ru) is formed by sputtering. As a result, the film for lower electrode 13a covers the surface of the third cap insulating film 63 and the surface (including the bottom portion of the hole 9) inside the hole 9. A resist 42 is then applied onto the entire surface and ashed under predetermined conditions. The resist 42 covers the film for lower electrode 13a only on the bottom portion of the hole 9 and a portion midway of the side wall.

Figure 17D:
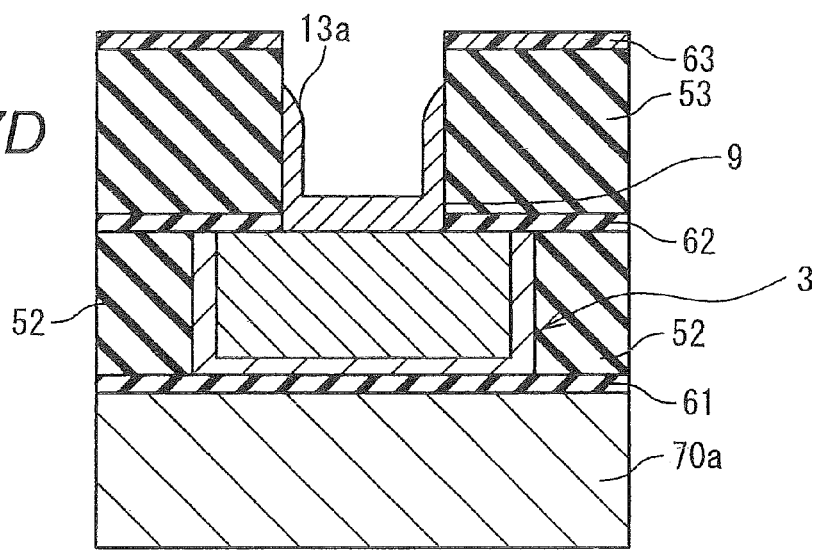
FIG. 17D is a cross-sectional view showing the method of manufacturing the resistance change nonvolatile memory device according to the third embodiment of the invention.

Next, as shown in FIG. 17D, the film for lower electrode 13a is etched back. The resist 42 is then removed by asking. As a result, the lower electrode 13a is formed continuously on the bottom portion of the hole 9 and from the bottom portion to a position midway of the side wall.

Figure 17E:
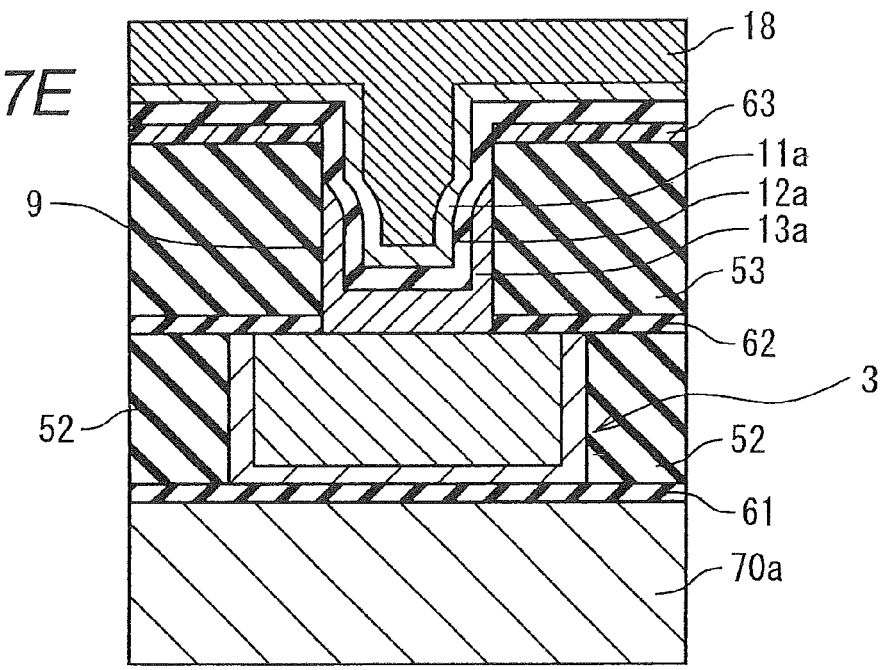
FIG. 17E is a cross-sectional view showing the method of manufacturing the resistance change nonvolatile memory device according to the third embodiment of the invention.

Then, as shown in FIG. 17E, a film for resistance change layer 12a, a film for upper electrode 11a, and a film for buried layer 18 are formed so as to cover therewith the surface of the third stopper insulating film 63, the upper side wall inside the hole 9, and the surface of the lower electrode 13a. In the present embodiment, a nickel oxide film (NiO) is used as the film for resistance change layer 12a, a titanium nitride film (TiN) is used as the film for upper electrode 13a, and tungsten (W) is used as the film for buried layer 18. These films are formed by sputtering. Incidentally, the buried layer 18 may be made of the same material as that of the upper electrode 11a. Alternatively, by forming a thick film for the upper electrode 11a or the like, the buried layer 18 may be omitted.

Figure 17F:
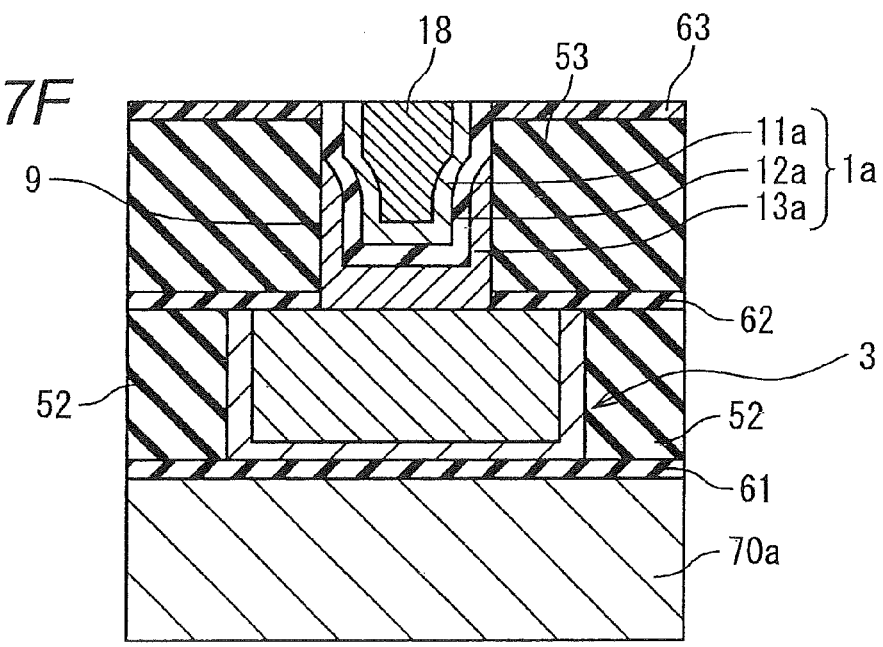
FIG. 17F is a cross-sectional view showing the method of manufacturing the resistance change nonvolatile memory device according to the third embodiment of the invention.

Next, as shown in FIG. 17F, the surface is planarized by a CMP step. As a result, the resistance change element 1a is entirely buried in the hole 9 (opening portion). At this time, the lower electrode 13a is formed continuously on the bottom portion of the hole 9 and from the bottom portion to a position midway of the side wall. The end portion of the lower electrode however is on the side wall of the hole 9 and does not reach the upper portion thereof. The resistance change layer 12a is formed on the lower electrode 13a and on the side wall of the hole 9. The end portion of it reaches the upper portion of the hole 9. The upper electrode 11a is formed so as to cover the inner surface of the resistance change layer 12a. The end portion of the upper electrode reaches the upper portion of the hole 9.

Then, the steps of FIG. 7H (except the formation of the third stopper insulating film 63) and FIG. 7I in the first embodiment are conducted.

By using the method described above, the resistance change nonvolatile memory device according to the third embodiment of the invention is manufactured.

Materials used for the lower electrode 13a, the resistance change layer 12a, and the upper electrode 11a are similar to those used in the first embodiment.

The present embodiment can produce advantages similar to those of the first embodiment. In addition, not selective CVD growth but a typical film formation process can be employed. Using it leads to a reduction in manufacturing cost. In addition, the device of the present embodiment can also be applied to the semiconductor device as described in the second embodiment.

The invention is not limited to the above-described embodiments. Each of the above-described embodiments can be modified or changed as needed without departing from the scope of the technical concept of the invention.

What is claimed is:

1. A resistance change nonvolatile memory device, comprising:
   a first wiring;
   an interlayer insulating layer formed over the first wiring; and
   a second wiring formed over the interlayer insulating layer,
   wherein the interlayer insulating layer is interposed between the first wiring and the second wiring and includes a hole having a width not greater than a width of the first wiring,
   wherein the resistance change nonvolatile memory device further comprises:
   a lower electrode formed at a bottom portion of the hole and contacting the first wiring;
   a resistance change layer formed on the lower electrode; and
   an upper electrode formed over the resistance change layer,
   wherein the lower electrode, the resistance change layer, and the upper electrode are formed inside the hole,
   wherein an entirety of the resistance change layer is disposed inside the hole,
   wherein the first wiring includes copper, while the lower electrode includes at least one metal selected from the group constituting of ruthenium, tungsten, cobalt, platinum, gold, rhodium, iridium, and palladium,
   wherein the resistance change layer comprises:
   a first portion formed on a top surface of the lower electrode, and
   a second portion formed on a side wall of the hole, and
   wherein a lower surface of the upper electrode is formed on a top surface of the first portion, and
   wherein a distance between a top edge of the second portion and the lower electrode is greater than a distance between the lower surface of the upper electrode and the lower electrode.

2. The resistance change nonvolatile memory device according to claim 1, wherein the copper has an orientation along a (111) plane, while the lower electrode contains ruthenium and the ruthenium has an orientation along a (002) plane.

3. The resistance change nonvolatile memory device according to claim 1, wherein the lower electrode further extends from a bottom portion to a midway point of a side wall.

4. The resistance change nonvolatile memory device according to claim 1, wherein the resistance change layer includes an oxide using a material different from a material used for the lower electrode.

5. A semiconductor device comprising:
   a plurality of resistance change nonvolatile memory devices, the resistance change nonvolatile memory devices each comprising a device as claimed in claim 1; and
   a logic circuit using the resistance change nonvolatile memory devices.

6. A resistance change nonvolatile memory device, comprising:
   a first wiring;
   an interlayer insulating layer formed over the first wiring; and
   a second wiring formed over the interlayer insulating layer,
   wherein the interlayer insulating layer is interposed between the first wiring and the second wiring and has a hole having a width not greater than a width of the first wiring,
   wherein the resistance change nonvolatile memory device further comprises:
   a lower electrode formed at a bottom portion of the hole while being brought into contact with the first wiring;
   a resistance change layer formed on the lower electrode; and
   an upper electrode formed over the resistance change layer, and
   wherein the lower electrode, the resistance change layer, and the upper electrode are formed inside the hole,
   wherein an entirety of the resistance change layer is disposed inside the hole,
   wherein the resistance change layer comprises: a first portion formed on the top surface of the lower electrode, and
   a second portion formed on the side wall of the hole, wherein the lower surface of the upper electrode is formed on a top surface of the first portion,
   wherein a distance between a top edge of the second portion and the lower electrode is greater than a distance between lower surface of the upper electrode and the lower electrode, and
   wherein a top edge of the second portion and a top edge of the upper electrode are, brought into contact with a bottom surface of the second wiring.

7. The resistance change nonvolatile memory device according to claim 6, wherein the first wiring includes copper and the lower electrode includes at least a metal selected from the group consisting of ruthenium, tungsten, cobalt, platinum, gold, rhodium, iridium, and palladium.

8. The resistance change nonvolatile memory device according to claim 7, wherein the copper has an orientation along a (111) plane, while the lower electrode contains ruthenium and the ruthenium has an orientation along a (002) plane.

9. The resistance change nonvolatile memory device according to claim 6, wherein the first wiring includes aluminum and the lower electrode contains at least one metal selected from the group consisting of tungsten, tantalum, and titanium.

10. The resistance change nonvolatile memory device according to claim 6, wherein the first wiring includes silicon and the lower electrode contains at least one metal selected from the group consisting of tungsten, tantalum, and titanium.

11. A method of manufacturing a resistance change nonvolatile memory device, said method comprising:
  forming, in an interlayer insulating layer formed over a first wiring, a hole having a width not greater than a width of the first wiring;
  forming a resistance change element inside the hole; and
  forming a second wiring over the resistance change element so as to bring the second wiring into contact with the resistance change element,
  wherein said forming said resistance change element comprises:
    forming a lower electrode at a bottom portion of the hole while bringing the lower electrode into contact with the first wiring;
    forming a first film for a resistance change layer on the lower electrode;
    forming a second film for an upper electrode over the first film; and
    removing the first film and the second film over the interlayer insulating layer and forming the resistance change layer on the lower electrode and the upper electrode on the resistance change layer in the hole,
  and forming an entirety of the resistance change layer inside the hole,
  wherein the first wiring includes copper and the lower electrode includes at least one metal selected from the group consisting of ruthenium, tungsten, cobalt, platinum, gold, rhodium, iridium, and palladium,
  wherein said forming the resistance change layer comprises:
    forming a first portion on the top surface of the lower electrode, and
    forming a second portion on the side wall of the hole, wherein a lower surface of the upper electrode is formed on a top surface of the first portion, and
    wherein a distance between a top edge of the second portion and the lower electrode is greater than a distance between the lower surface of the upper electrode and the lower electrode.

12. The method of manufacturing a resistance change nonvolatile memory device according to claim 11, wherein the copper has an orientation along a (111) plane, while the lower electrode contains ruthenium and the ruthenium has an orientation along a (002) plane.

13. The method of manufacturing a resistance change nonvolatile memory device according to claim 11, wherein the resistance change layer includes an oxide using a material different from a material used for the lower electrode.

14. A method of manufacturing a resistance change nonvolatile memory device, said method comprising:
  forming, in an interlayer insulating layer formed over a first wiring, a hole having a width not greater than a width of the first wiring;
  forming a resistance change element inside the hole; and
  forming a second wiring over the resistance change element so as to bring the second wiring into contact with the resistance change element,
  wherein the forming the resistance change element comprises:
    forming a lower electrode at a bottom portion of the hole while bringing the lower electrode into contact with the first wiring;
    forming a first film for a resistance change layer on the lower electrode;
    forming a second film for an upper electrode over the first film; and
    removing the first film and the second film over the interlayer insulating layer,
  and forming the resistance change layer on the lower electrode and the upper electrode on the resistance change layer in the hole,
  and forming an entirety of the resistance change layer inside the hole,
  wherein said forming the resistance change layer comprises:
    forming a first portion on the top surface of the lower electrode, and
    forming a second portion on the side wall of the hole, wherein a lower surface of the upper electrode is formed on a top surface of the first portion,
    wherein a distance between a top edge of the second portion and the lower electrode is greater than a distance between lower surface of the upper electrode and the lower electrode, and
    wherein the top edge of the second portion and a top edge of the upper electrode are, brought into contact with the bottom surface of the second wiring.

15. The method of manufacturing a resistance change nonvolatile memory device according to claim 14, wherein the forming a lower electrode comprises, inside the hole, causing a selective growth of the lower electrode over the first wiring.

16. The method of manufacturing a resistance change nonvolatile memory device according to claim 15, wherein the first wiring includes copper and the lower electrode includes at least one metal selected from the group consisting of ruthenium, tungsten, cobalt, platinum, gold, rhodium, iridium, and palladium.

17. The method of manufacturing a resistance change nonvolatile memory device according to claim 16, wherein the copper has an orientation along a (111) plane, while the lower electrode includes ruthenium and the ruthenium has an orientation along a (002) plane.

18. The method of manufacturing a resistance change nonvolatile memory device according to claim 15, wherein the first wiring includes aluminum and the lower electrode includes at least one metal selected from the group consisting of tungsten, tantalum, and titanium.

19. The method of manufacturing a resistance change nonvolatile memory device according to claim 15, wherein the first wiring includes silicon and the lower electrode includes at least one metal selected from the group consisting of tungsten, tantalum, and titanium.

20. The method of manufacturing a resistance change nonvolatile memory device according to claim 14, wherein forming a lower electrode comprises:
  forming a third film for a lower electrode so as to cover a surface of the interlayer insulating layer and an inner surface of the hole;
  forming a protective film so as to cover the third film at the bottom portion of the hole and midway of a side wall;
  removing a portion of the third film other than a portion covered with the protective film; and
  removing the protective film.

* * * * *